(12) United States Patent
Yurash

(10) Patent No.: US 12,710,310 B2
(45) Date of Patent: Aug. 18, 2026

(54) NANOWIRE AVALANCHE PHOTODETECTOR

(71) Applicant: The Boeing Company, Arlington, VA (US)

(72) Inventor: Brett Alexander Yurash, Venice, CA (US)

(73) Assignee: The Boeing Company, Arlington, VA (US)

( * ) Notice: Subject to any disclaimer, the term of this patent is extended or adjusted under 35 U.S.C. 154(b) by 581 days.

(21) Appl. No.: 18/334,919

(22) Filed: Jun. 14, 2023

(65) Prior Publication Data

US 2024/0423104 A1 Dec. 19, 2024

(51) Int. Cl.

| | |
|---|---|
| ***G01J 1/42*** | (2006.01) |
| ***G01J 1/44*** | (2006.01) |
| ***H10N 60/84*** | (2023.01) |

(52) U.S. Cl.

CPC ................ *G01J 1/42* (2013.01); *H10N 60/84* (2023.02); *G01J 2001/442* (2013.01)

(58) Field of Classification Search

CPC ...... G01J 1/42; G01J 2001/442; G01J 1/4228; G01J 1/0425; H10N 60/84; H10N 60/30; H10N 69/00; G06N 10/00

See application file for complete search history.

(56) References Cited

U.S. PATENT DOCUMENTS 10,620,044 B2 4/2020 Thompson et al.
11,029,203 B2 6/2021 Najafi et al.
11,994,426 B1 * 5/2024 Najafi ........................ G01J 1/44
2013/0143744 A1 6/2013 Marsili et al.
2014/0103295 A1 * 4/2014 Wang .................... H10F 77/146 977/954
2020/0256722 A1 * 8/2020 Najafi ................... G01J 1/0407
2021/0381884 A1 * 12/2021 Walter .................. G01J 1/0425
2024/0337529 A1 * 10/2024 Beutel .................... H04B 10/70
2024/0361181 A1 * 10/2024 Keshavarz Akhlaghi .................. G01J 1/0252
2025/0290796 A1 * 9/2025 Ravi ......................... G01J 1/44

OTHER PUBLICATIONS

Cheng et al., "Large-Area Superconducting Nanowire Single-Photon Detector With Double-Stage Avalanche Structure", IEEE Transactions on Applied Superconductivity, vol. 27, No. 4, Jun. 2017, 5 pages. https://ieeexplore.ieee.org/document/7792652.

Ejrnaes et al., "A cascade switching superconducting single photon detector", Applied Physics Letter, vol. 91, 262509, Dec. 26, 2007, 4 pages. https://doi.org/10.1063/1.2828138.

Ferrari et al., "Waveguide-integrated superconducting nanowire single-photon detectors", Nanophontonics 2018, vol. 7, Issue 11, 34 pages. https://doi.org/10.1515/nanoph-2018-0059.

(Continued)

*Primary Examiner* — Jennifer D Bennett

(74) *Attorney, Agent, or Firm* — Yee & Associates, P.C.

(57) ABSTRACT

A nanowire photodetection system comprising an optical waveguide and superconducting nanowires. The optical waveguide is located on a substrate. The superconducting nanowires are electrically connected in parallel to connector wires located on both sides of the optical waveguide. A set of the superconducting nanowires cross a width of the optical waveguide and absorb a photon in the optical waveguide.

19 Claims, 21 Drawing Sheets

(56) References Cited

OTHER PUBLICATIONS

Marsili et al., "Single-Photon Detectors Based on Ultranarrow Superconducting Nanowires", Nano Letters, 2011, vol. 11, Issue 5, Apr. 1, 2011, 6 pages. https://doi.org/10.1021/nl2005143.

Marsili et al., "Supporting Information: Single-Photon Detectors Based on Ultranarrow Superconducting Nanowires", Nano Letters, 2011, vol. 11, Issue 5, Apr. 1, 2011, 14 pages. https://pubs.acs.org/doi/10.1021/nl2005143.

Orus et al., "Critical current modulation induced by an electric field in superconducting tungsten carbon nanowires", Scientific Reports, vol. 11, Article No. 17698, Sep. 6, 2021, 9 pages. https://www.nature.com/articles/s41598-021-97075-z.

Zhao et al., "Eight-fold signal amplification of a superconducting nanowire single-photon detector using a multiple-avalanche architecture", Optics Express, vol. 22, Issue 20, 8 pages. https://doi.org/10.1364/OE.22.024574.

Zhu et al., "A scalable multi-photon coincidence detector based on superconducting nanowires", Nature Nanotechnology, vol. 13, Jun. 4, 2018, 7 pages. https://www.nature.com/articles/s41565-018-0160-9.

Zhu et al., "A scalable multi-photon coincidence detector based on superconducting nanowires", Nature Nanotechnology, vol. 13, Jun. 4, 2018, 16 pages.https://arxiv.org/abs/1711.10546.

* cited by examiner 1400
1500
1206
1204
1400
1208
1210
1400
1200
1202

NANOWIRE AVALANCHE PHOTODETECTOR

BACKGROUND INFORMATION

1. Field

The present disclosure relates generally to photon detection and in particular, to photon detection using superconducting nanowire detectors.

2. Background

Superconducting nanowires can be used to detect photons. These type of detectors are capable of detecting extremely small quantities of light such as single photons. These superconducting nanowires can be used as superconducting nanowire single-photon detectors (SNSPDs) for optical waveguides. These types of photodetectors can be used to detect photons with extremely high sensitivity.

These types of photodetectors operate on the principle of superconductivity and photon absorption. When a single-photon interacts with a superconducting nanowire, the superconducting state is broken resulting in the nanowire having a period of time in which superconductivity is absent. In this state, the nanowire becomes resistive. This event generates an electrical signal that can be measured. This signal indicates the detection of a photon.

When applied current (Iapp) to a superconducting nanowire single-photon detector is below critical current for the detector, a nanowire in the detector has no electrical resistance. This is a superconducting state for the superconducting nanowire single-photon detector.

When a certain amount of current, the critical current (Ic), is applied to the nanowire, the current density is high enough that the nanowire is no longer superconducting.

At this point, the nanowire becomes resistive and is in a normal state. When a current less than critical current is applied to the superconducting nanowire single-photon detector, this detector is capable of operating as a single photon detector. When a photon is absorbed by the superconducting metal in the nanowire, a hot spot nucleation (HSN) event occurs. This event increases resistance in the local area.

When the local resistance increases to a large enough value, then the current density of the nanowire can exceed the critical current. This event causes the nanowire to return to the normal state. After a period of time, the nanowire then relaxes back to equilibrium, which is a superconducting state.

A superconducting nanowire single-photon detector cannot detect another photon until the nanowire in the superconducting nanowire single-photon detector returns to a superconducting state. This period of time to return to the superconducting state is the reset time. The rapid change in resistance upon absorption of a photon and relaxation back to the superconducting state can be detected as a voltage pulse. The reset time determines the rate at which single photons can be detected. Typically, higher applied currents improve the performance of a superconducting nanowire single-photon detector.

Superconducting nanowire detectors can be used with optical waveguides to detect light in the optical waveguides as an integrated detector. These integrated detectors can be used in different applications such as to send and receive quantum states. Another application can be for high speed data transmission.

SUMMARY

An embodiment of the present disclosure provides a nanowire photodetection system comprising an optical waveguide and superconducting nanowires. The optical waveguide is located on a substrate. The superconducting nanowires are electrically connected in parallel to connector wires located on both sides of the optical waveguide. A set of the superconducting nanowires cross a width of the optical waveguide and absorb a photon in the optical waveguide.

Another embodiment of the present disclosure provides a nanowire photodetection system comprising an optical waveguide, superconducting nanowires, and a set of tuning electrodes. The optical waveguide is located on a substrate. The superconducting nanowires are electrically connected in parallel to superconducting connector wires located on both sides of the optical waveguide on the substrate. A set of the superconducting nanowires cross a width of the optical waveguide and absorb a photon in the optical waveguide. The set of tuning electrodes operate to change critical currents for the superconducting nanowires.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
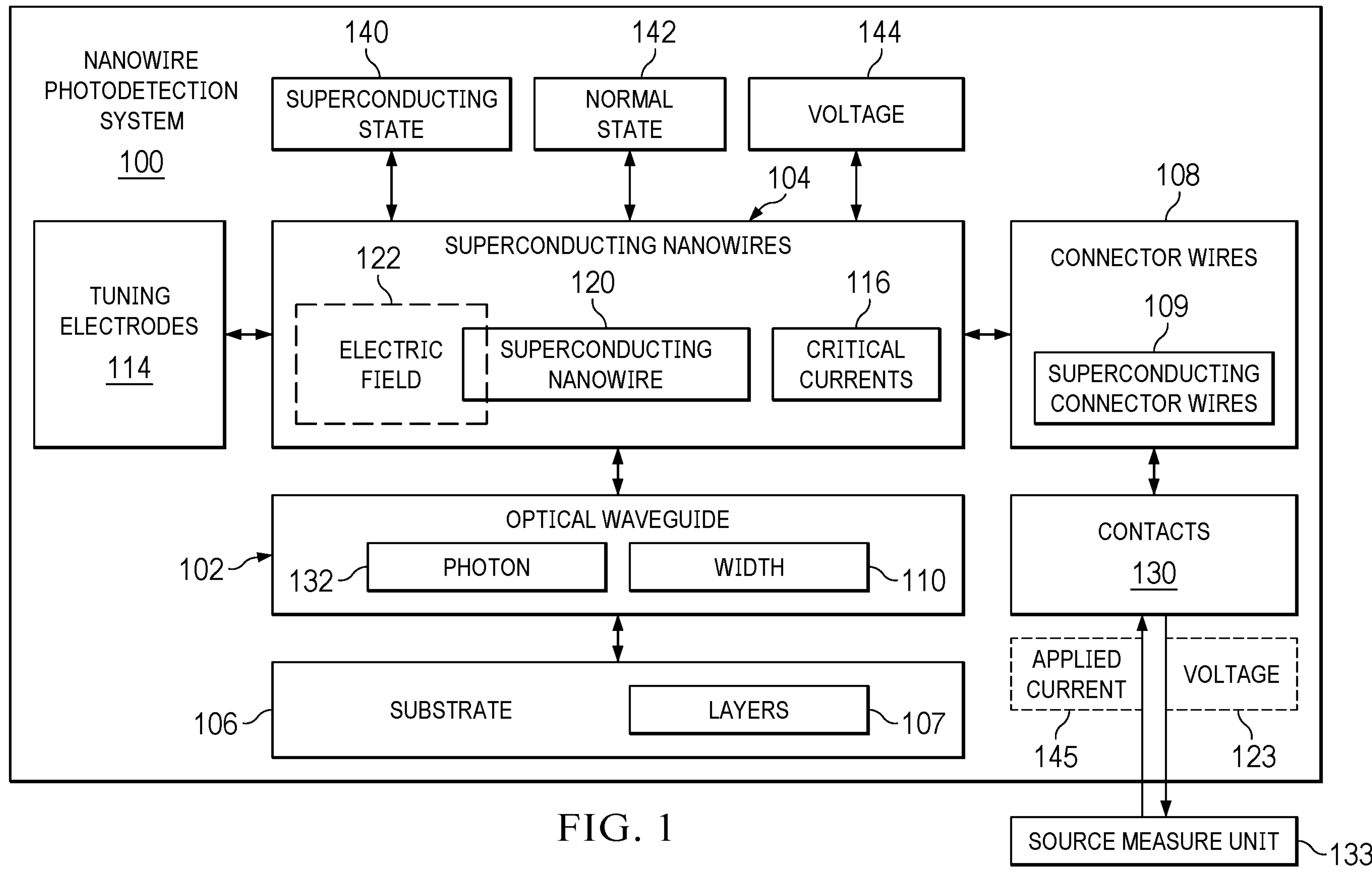
FIG. 1 is an illustration of a block diagram of a nanowire detection system in accordance with an illustrative embodiment.

The illustrative embodiments recognize and take into account one or more different considerations. For example, current waveguide-integrated superconducting nanowire single-photon detectors with smaller geometries can enable increased performance except with regard to detection efficiency. Thus, it is desirable to have superconducting nanowire single-photon detectors that have desired speed, jitter, and signal-to-noise ratio (SNR), without reducing detection efficiency.

Detecting a single photon event in a waveguide structure with improved signal-to-noise ratio is desirable. Further, improving the efficiency, speed, and jitter of photodetectors enables faster and more accurate measurements, which is desirable for many applications. Some applications are hosted on integrated photonic chips, which typically have superior performance in terms of size, weight, and power compared to their bulk counterparts.

Integrating photodetectors onto integrated photonic chips rather than coupling light off the chip and routing light to a detector is desirable. In addition to reducing losses, placing photodetectors directly on the same chip with a waveguide can reduce the size or footprint of the system.

Even though current single-wire superconducting nanowire single-photon detectors offer superior performance compared to other types of photodetectors, further increasing performance of this type of photodetector is desirable. For example, in a typical entanglement-swapping protocol, the simultaneous detection of four photons, one at each of at least four independent detectors, is required. The rate at which that measurement can be achieved is proportional to the fourth power of the detection efficiency. This measurement assumes that each independent detector has the same detection efficiency. As a result, any improvement in detection efficiency can have large impacts on measurement times.

The voltage pulse produced by single photon absorption in a superconducting nanowire single-photon detector typically needs amplification before a photon can be accurately detected. Low noise amplification can be used to preserve a signal. However, this type of amplification often involves large, expensive, and complex electronics. Furthermore, observations have shown that the signal-to-noise ratio (SNR) of superconducting nanowire single-photon detectors correlates positively with nanowire width. However, wider nanowires are less sensitive to longer wavelength photons, such as those used in telecommunications, which have a wavelength around 1.5 microns. Thus, improving the signal-to-noise ratio of superconducting nanowire single-photon detectors can improve detecting longer wavelength photons.

The signal-to-noise ratio of superconducting nanowire single-photon detectors can be improved by a factor of N by using N nanowires connected in parallel. In addition, the reset time can be reduced by a factor of up to N by reducing the kinetic inductance of the detector by up to a factor of N.

For example, two nominally identical nanowires connected in parallel can be biased close to their critical current. The absorption of a single photon by a first nanowire in the nanowires causes a hot spot nucleation event. The first nanowire goes into the normal, resistive state. This transition forces some current from the first nanowire to flow into the second nanowire.

This flow of current causes this second nanowire to go into normal state because this second nanowire was already biased close to the critical current. This normal state has a higher resistance than the superconducting state. The state change in the second nanowire can be referred to as the avalanche effect.

At this point, the circuit is highly resistive, and a voltage pulse is produced with amplitude equal to twice that expected by a superconducting nanowire single-photon detector using only one of the nanowires. This type of superconducting nanowire single-photon detector device with N parallel nanowires is often called a superconducting nanowire avalanche photodetector (SNAP) or a cascade switching superconducting nanowire photodetector.

In some situations where the application of a current is well below the critical current; more than one photon absorption event is required to initiate the avalanche effect. As a result, this detector generates a voltage pulse in response to a specific number of photons, greater than one, impinging on the optically active areas of the detector. Thus, this type of superconducting nanowire single-photon detector can operate in either a single-photon counting mode or multi-photon counting mode, depending on current applied across the device.

Although superconducting nanowire single-photon detectors with multiple nanowires in parallel offer advantages over superconducting nanowire single-photon detectors with a single nanowire, improvements are desirable to further increase performance. Improvements can be made in integrating a superconducting nanowire single-photon detector with multiple parallel nanowires on a waveguide.

For example, optical waveguides are often less than one micron wide and sometimes up to several microns wide. As a result, having an optically active region in the detector that efficiently absorbs photons in the waveguide is desirable. An optical waveguide can be 100 nanometers in height or potentially several hundred nanometers in height.

As another example, with the use of multiple parallel nanowires in superconducting nanowire single-photon detectors, imperfections can be introduced during manufacturing. These imperfections are also referred to as constrictions and increase the amount of resistance in a nanowire and reduce the critical current. As a result, device performance can be less than desired.

One or more illustrative examples provide configurations that can reduce the effect of manufacturing imperfections. As a result, the number of parallel nanowires can be increased. For example, with a parallel nanowires in a superconducting nanowire single-photon detector, if the first nanowire has more constrictions than the second nanowire, the first nanowire will have a lower critical current than the second nanowire. As result, the amount of current redirected into the second nanowire after the first nanowire goes into the normal state from absorbing a photon is insufficient for the second nanowire to enter the normal state. Thus, an avalanche effect may not occur, and the photon is not detected. For the avalanche effect to occur, all nanowires should be biased at a similar current and that the current is near each nanowire's critical current.

Thus, the illustrative examples can provide a photodetection system with improved detection of single photons or multiple photons. In one illustrative example, a photodetection system comprises an optical waveguide and superconducting nanowires. The optical waveguide is located on a substrate. The superconducting nanowires are electrically connected in parallel to connector wires located on both sides of the optical waveguide. A set of the superconducting nanowires cross a width of the optical waveguide and absorb a photon in the optical waveguide.

In another illustrative example, a set of tuning electrodes can be used to change critical currents for the superconducting nanowires. The set of tuning electrodes can be in locations relative to superconducting wires such that electric fields generated by these tuning electrodes can adjust the critical currents for one or more of the superconducting nanowires.

With reference now to the figures, and with reference to FIG. 1, an illustration of a block diagram of a nanowire detection system is depicted in accordance with an illustrative embodiment. This block diagram depicts functional components in nanowire photodetection system 100. The depiction of these functional components in this figure is not meant to imply or limit the manner in which these components can be physically located relative to each other.

In this illustrative example, nanowire photodetection system 100 comprises optical waveguide 102 and superconducting nanowires 104. In this example, optical waveguide 102 is located on substrate 106.

Being located on substrate 106 can mean that optical waveguide 102 is directly on substrate 106 such that optical waveguide 102 touches substrate 106. In other examples, being on substrate 106 can mean one or more layers are present between optical waveguide 102 and substrate 106.

In this illustrative example, substrate 106 is comprised of a set of layers 107. For example, the set of layers 107 for substrate 106 be a single layer of a material or can be multiple layers of materials. Substrate 106 can be an oxide layer. In another example, substrate 106 can be silicon dioxide on silicon or a silicon layer.

As used herein, a "set of" when used with reference to items means one or more items. For example, a set of layers is one or more layers.

In this illustrative example, optical waveguide 102 can be formed from different materials suitable for guiding photons. For example, optical waveguide 102 can be comprised of at least one of silicon (Si), silicon carbide (SiC), silicon nitride (SiN), lithium niobate (LiNbO3), or some other waveguiding material.

In this illustrative example, superconducting nanowires 104 are connected in parallel to connector wires 108 on both sides of optical waveguide 102 on substrate 106. In other words, a wire is located on either side of optical waveguide 102. In some illustrative examples, connector wires 108 can be superconducting connector wires 109.

In this illustrative example, superconducting nanowires 104 and superconducting connector wires 109 can be comprised of a number of different types of materials. For example, the superconducting materials can be selected from at least one of at least one of niobium nitride (NbN), niobium titanium nitride (NbTiN), niobium germanide (NbGe), tungsten silicide (WSi), molybdenum germanide (MoGe), molybdenum silicide (MoSi), niobium silicide (NbSi), or tantalum nitride (TaN), or other suitable materials. When connector wires 108 are not comprised of superconducting materials, other materials with a sufficiently low resistance to conduct a desired amount current can be used. For example, another material can be gold.

In this example, a set of superconducting nanowires 104 cross width 110 of optical waveguide 102. The set of superconducting nanowires 104 detected photon 132 in optical waveguide 102. In this illustrative example, detection of photon 132 occurs while photon 132 travels through optical waveguide 102.

In this illustrative example, nanowire photodetection system 100 can also include a set of tuning electrodes 114. The set of tuning electrodes 114 operate to change critical currents 116 for a number of superconducting nanowires 104. The set of tuning electrodes 114 are placed relative to the number of superconducting nanowires 104 such that the set of tuning electrodes 114 can change critical currents 116 for those number of superconducting nanowires 104.

The set of tuning electrodes 114 can be positioned relative to a superconducting nanowire 120 in superconducting nanowires 104 and operates to create electric field 122 with a strength in a region encompassing a portion of superconducting nanowire 120 such that a critical current for superconducting nanowire 120 changes in response to electric field 122. In this example, electrodes operate to equalize current flow through superconducting nanowires 104. Although, this example describes the set tuning electrodes 114 being located relative to superconducting nanowire 120, other tuning electrodes can be positioned relative to other superconducting nanowires in superconducting nanowires 104 in other examples.

In this illustrative example, connector wires 108 can be connected to a set of contacts 130. The set of contacts 130 can be, for example, contact pads. The set of contacts 130 to enable connecting nanowire photodetection system 100 to source measure unit (SMU) 133.

In this example, source measure unit (SMU) 133 can send applied current 121 to contacts 130 and detect voltage 123. Applied current 121 flows through superconducting nanowires 104 and connector wires 108. Voltage 123 can include changes that indicate absorption of photon 132 by a superconducting nanowire.

Source measure unit 133 is located off substrate 106 or off chip on which substrate 106 is located. In other illustrative examples, separate devices can be used to apply currents and detect voltages. For example, the current source can be used to generate applied current 121. Electrical test equipment can be used to detect the voltage pulse generated in response to nanowire photodetection system 100 detecting photon 132 for traveling through optical waveguide 102.

In the illustrative example, when connector wires 108 are other types of wires other than superconductor connector wires 109, connector wires 108 comprises a material and designed to deliver a current from superconducting nanowires 104 to contacts 130 at a level that is sufficient for use by source measure unit 133 to detect photon events.

In this illustrative example, the detection of photon 132 results in one or more of superconducting nanowires 104 changing from superconducting state 140 to normal state 142. The resistance of superconducting nanowires 104 and normal state 142 is increased as compared to superconducting state 140. This change results in the generation of voltage 144 that indicates the detection of photon 132. When one of superconducting nanowires 104 absorbs photon 132 and moves into normal state 142 from superconducting state 140 that superconducting nanowire becomes more resistive and current does not flow through or easily flow through that superconducting nanowire. This causes applied current 145 to flow through other superconducting nanowires in superconducting nanowires 104. This flow of applied current 145 can also cause those superconducting nanowires to move into normal state 142. This change in state is likely to occur because of biasing superconducting nanowires 104 to their critical currents. As result, an avalanche effect can occur resulting in higher voltages being generated in response to detecting photon 132 as compared to only a single superconducting nanowire detecting photon 132.

With the use of superconducting nanowires 104 connected in parallel across optical waveguide 102, increased voltages can occur when multiple superconducting nanowires 104 move into normal state 142 from superconducting state 140 in response to one of superconducting nanowires 104 absorbing photon 132.

The illustration of nanowire photodetection system 100 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, source measure unit 133 can be a semiconductor structures located on substrate 106 in some illustrative examples. Additionally, in some illustrative examples, source measure unit 133 can be considered part of nanowire photodetection system 100. Additionally, nanowire photodetection system 100 can include one or more optical waveguides in addition to optical waveguide 102. With additional optical waveguides, additional superconducting manner wires in superconducting nanowires 104 can cross these additional optical waveguides to absorb photons traveling through those optical waveguides.

Detailed embodiments of the claimed structures and methods are disclosed herein; however, it is to be understood that the disclosed embodiments are merely illustrative of the claimed structures and methods that can be embodied in various forms. In addition, each of the examples given in connection with the various embodiments is intended to be illustrative, and not restrictive.

Further, the figures are not necessarily to scale, some features can be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper," "lower," "right," "left," "vertical," "horizontal," "top," "bottom," and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g., interface layer, can be present between the first element and the second element.

In this disclosure, when an element, such as a layer, region, or substrate is referred to as being "on" or "over" another element, the element can be directly on the other element or intervening elements can also be present. In contrast, when an element is referred to as being "directly on", "directly over", or "on and in direct contact with" another element, intervening elements are not present, and the element is in contact with the other element.

The processes, steps, and structures described below do not form a complete process flow for manufacturing integrated circuits. The disclosure can be practiced in conjunction with integrated circuit fabrication techniques currently used in the art, and only so much of the commonly practiced process steps are included as necessary for an understanding of the different examples of the present disclosure. The figures represent cross-sections of a portion of an integrated circuit during fabrication and are not drawn to scale, but instead are drawn so as to illustrate different illustrative features of the disclosure.

Figure 2:
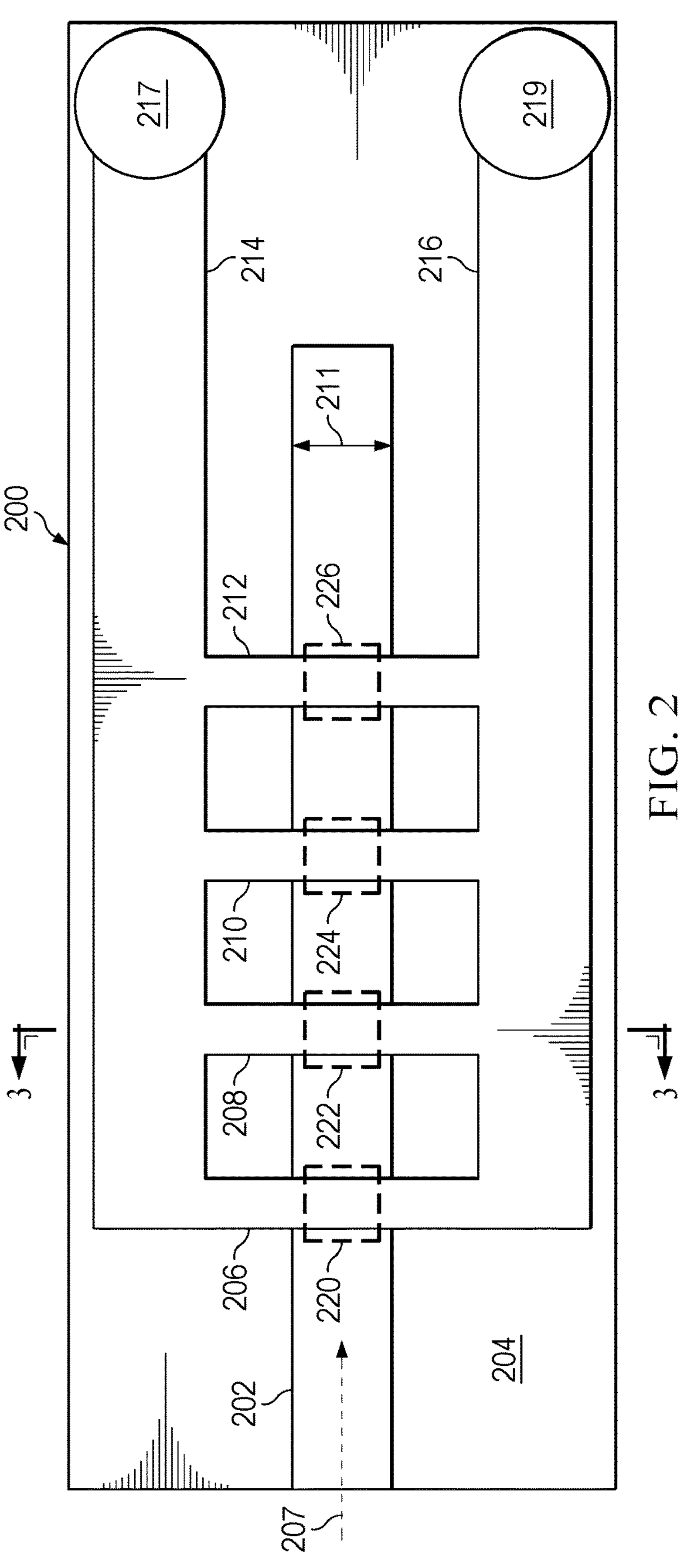
FIG. 2 is an illustration of a nanowire photodetection system in accordance with an illustrative embodiment.

With reference now to FIG. 2, an illustration of a nanowire photodetection system is depicted in accordance with an illustrative embodiment. In this illustrative example, nanowire photodetection system 200 is an example of an implementation for nanowire photodetection system 100 in FIG. 1.

As depicted, nanowire photodetection system 200 is shown in a plan view and comprises optical waveguide 202 located on substrate 204. In this example, superconducting nanowire 206, superconducting nanowire 208, superconducting nanowire 210, and superconducting nanowire 212 extend across width 211 of optical waveguide 202. These nanowires are connected in parallel to superconducting connector wire 214 and superconducting connector wire 216 located on either side of optical waveguide 202. More specifically, the superconducting nanowires are electrically connected in parallel by having first ends connected to a first superconducting connector wire, superconducting connector wire 214, and second ends connected to a second superconducting connector wire, superconducting connector wire 216.

First superconducting connector wire 214 has contact pad 217, and second superconducting connector wire 216 has contact pad 219. These contact pads connect nanowire photodetection system 200 to other devices that can detect currents generated in response to detecting photons 207.

Further in this example, each of the superconducting nanowires depicted in this example have an active sensor area. As depicted, each of the superconducting nanowires has an active sensor area over width 211 of optical waveguide 202. For example, superconducting nanowire 206 has active sensor area 220, superconducting nanowire 208 has active sensor area 222, superconducting nanowire 210 has active sensor area 224, and superconducting nanowire 212 has active sensor area 226.

In this example, an active sensor area is an area where the electric field of photons 207 travelling through optical waveguide 202 overlaps with electrons in a superconducting nanowire. This area is an area where the superconducting nanowire can absorb photons.

In this illustrative example, a current can be applied to nanowire photodetection system 200 such that the current flows through the different superconducting nanowires.

In this illustrative example, the portion of each superconducting nanowire in a sensor active region is biased near the critical current through the nanowire. In response to a superconducting nanowire absorbing a photon in photons 207, the nanowire changes from a superconducting state to a normal state. In this normal state, increased resistance is present. This forces current applied to nanowire photodetection system 200 to flow into the other superconducting nanowires. The other superconducting nanowires being biased close to the critical current also shifts into a normal resistive state. This progressive shifting of states of the superconducting nanowires is an avalanche effect. In response to this event in which the nanowires increase resistance, a voltage pulse is produced that indicates the detection of the photon.

Increasing the performance in detecting photons 207 traveling through optical waveguide 202 can involve reducing constrictions occurring in the portion of the nanowires in the active sensor area in regions and in adjacent portions. Constrictions are regions or portions of the superconducting material in the nanowire that impede the flow of current to the superconducting material. These constrictions can occur through imperfections in the superconducting material. These imperfections can occur during manufacturing or environmental conditions during the detector over time.

In these illustrative examples, optical waveguide 202 can have a cladding on at least one side of optical waveguide 202. With this use of the cladding, a portion of the superconducting nanowires is substantially planar above optical waveguide 202 and, on a region, adjacent to optical waveguide 202. Example implementations for this feature are shown in FIGS. 3-6. These figures depict cross-sections and the use of cladding in nanowire photodetection system 200 in FIG. 2. These cross-sections are examples of different cross-sections that can be implemented in nanowire photodetection system 200 in FIG. 2 in a direction taken along lines 3-3 in FIG. 2.

Figure 3:
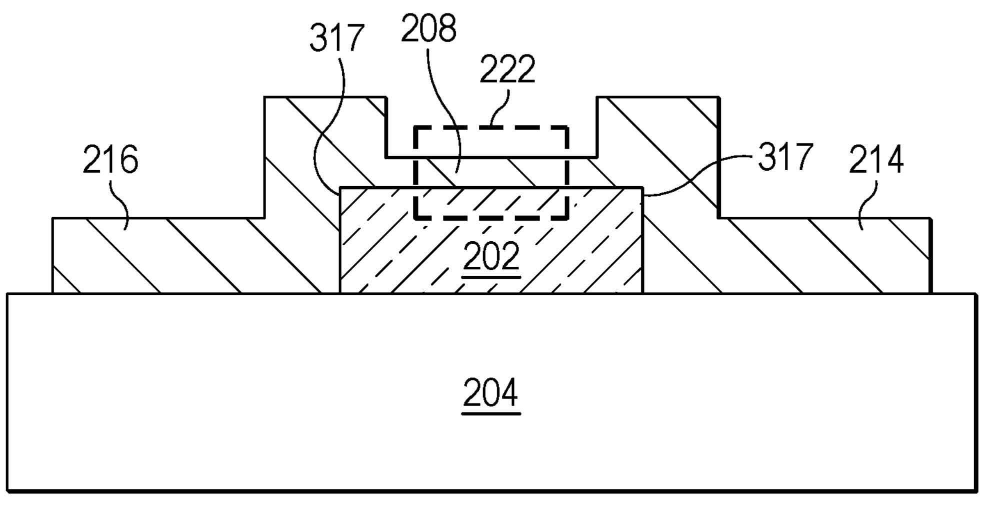
FIG. 3 is an illustration of a cross-sectional view of a nanowire photodetection system in accordance with an illustrative embodiment.

With reference to FIG. 3, an illustration of a cross-sectional view of nanowire photodetection system 200 taking along lines 3-3 in FIG. 2 is shown in accordance with an illustrative embodiment. In this cross-sectional view, the superconducting material in superconducting nanowire 208 in active sensor area 222 has a thickness needed for optimal device performance. Superconducting connector wire 214 and superconducting connector wire 216 at edges 317 of optical waveguide 202 and beyond can increase in thickness. This increase in thickness can allow increased current to flow through the superconducting material at the thicker sections of superconducting connector wire 214 and superconducting connector wire 216.

Without any constrictions, the critical current of the thicker regions of superconducting connector wire 214 and superconducting connector wire 216 is larger than the critical current of the superconducting nanowire 208 in active sensor area 222, and therefore does not degrade the performance of nanowire photodetection system 200.

In the illustrative example, the location at which thickness is increased for superconducting connector wire 214 and superconducting connector wire 216 can be balanced with the consideration of the mode profile of photons in the waveguide. A photon absorbed in the thicker regions will not cause the superconducting nanowires in nanowire photodetection system 200 to change to a normal resistive state. As result, photons are not detected.

As a result, the increase in thickness in superconducting connector wire 214 and superconducting connector wire 216 should be as close as possible to edges 317 of optical waveguide 202 where less overlap is present with the optical mode in optical waveguide 202. With the possibility of imperfections arising near edges 317 of optical waveguide 202, the thicker superconducting material in superconducting connector wire 214 and second superconducting connector wire 216 result in a larger critical current. The thickness of superconducting material in that region should be thick enough so that even with constrictions, the critical current for the superconducting connector wires is above the critical current of superconducting nanowire 208 in active sensor area 222.

Thus, constrictions caused by abrupt transitions in superconducting material and the surrounding environment do not degrade performance of nanowire photodetection system 200. In one illustrative example, the thickness of the thicker region in superconducting connector wire 214 and superconducting connector wire 216 can be substantially the same thickness as superconducting nanowire 208 in the active sensor area 222. For example, substantially the same thickness can be, for example, several nm thicker or tens of nm thicker. Further in the illustrative example, the change in thickness could be a smooth transition over some lateral distance, or consist of one or more abrupt transitions over the lateral distance, or some combination thereof.

Figure 4:
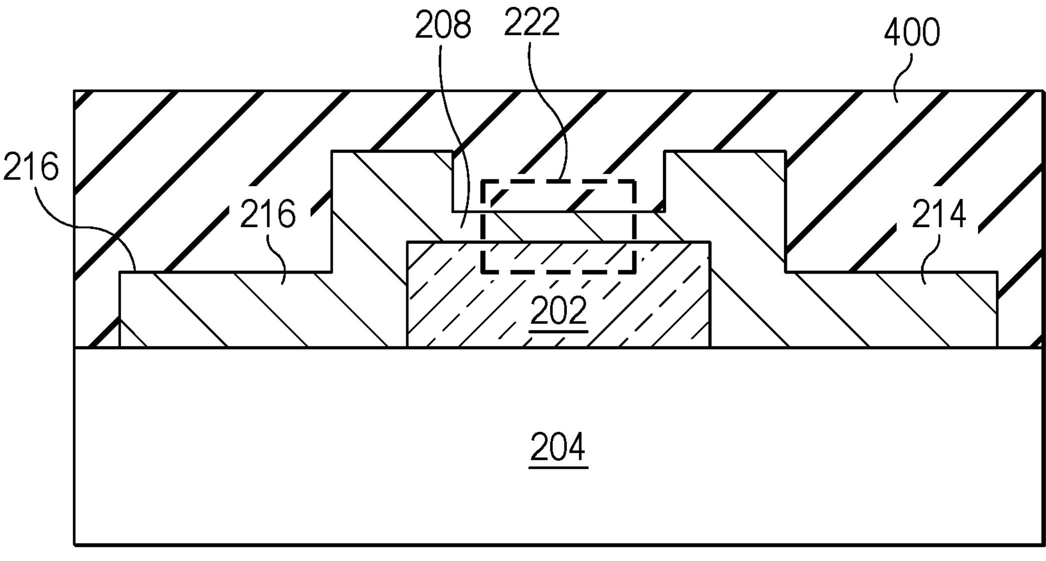
FIG. 4 is an illustration of a cross-sectional view of nanowire photodetection system in accordance with an illustrative embodiment.

Turning now to FIG. 4, an illustration of a cross-sectional view of nanowire photodetection system is depicted in accordance with an illustrative embodiment. In this example, this figure shows a nanowire photodetection system 200 taken along lines 3-3 in FIG. 2 is shown. In this cross-sectional view, top cladding 400 is present in nanowire photodetection system 200.

Top cladding 400 can aid in protecting the superconducting material in superconducting connector wire 214, superconducting connector wire 216, and superconducting nanowire 208 from foreign contamination and material degradation, such as oxidation. Further, top cladding 400 can also provide other performance features. In this example, top cladding 400 can be a single layer or multiple layers of materials of similar or varying thicknesses. Further top cladding 400 can be comprised of any material. In illustrative examples, top cladding 400 can have a low refractive index that can be provided using material such as silicon dioxide, hafnium oxide, aluminum oxide, aluminum nitride, silicon nitride, silicon oxynitride, or other suitable material.

Figure 5:
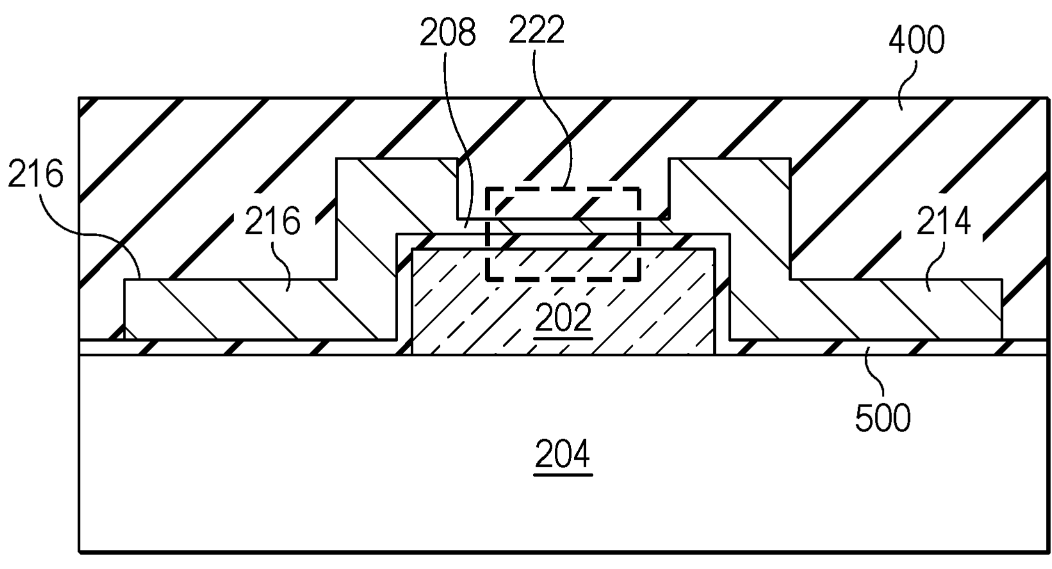
FIG. 5 is an illustration of a cross-sectional view of a nanowire photodetection system in accordance with an illustrative embodiment.

With reference to FIG. 5, an illustration of a cross-sectional view of a nanowire photodetection system is depicted in accordance with an illustrative embodiment. In this example, this figure shows a nanowire photodetection system 200 taken along lines 3-3 in FIG. 2 is shown. In this cross-sectional view, interlayer 500 is present in addition to top cladding 400 in nanowire photodetection system 200.

In this illustrative example, interlayer 500 is located between optical waveguide 202 and superconducting material in superconducting connector wire 214, superconducting connector wire 216, and superconducting nanowire 208. Interlayer 500 can be configured to provide a number of different features. Interlayer 500 can improve the quality of the superconducting material by reducing imperfections caused by the material interfaces. For example, the superconducting material and waveguide might have a bad interface which causes many imperfections in the superconducting material. Interlayer 500 could have a favorable interaction with the superconducting material such that the interface there does not cause imperfections in the superconducting material. As another example, interlayer 500 can also be configured to be used as a wavelength filter.

In this illustrative example, interlayer 500 can be comprised of a material such as silicon dioxide, aluminum oxide, aluminum nitride, silicon nitride, or some other material. Interlayer 500 can be comprised pf the same material as the cladding.

Illustration of nanowire photodetection system 200 in FIGS. 3-5 depict connector wires in the form of superconductor connector wires that have different heights in regions adjacent to optical waveguide 202.

Figure 6:
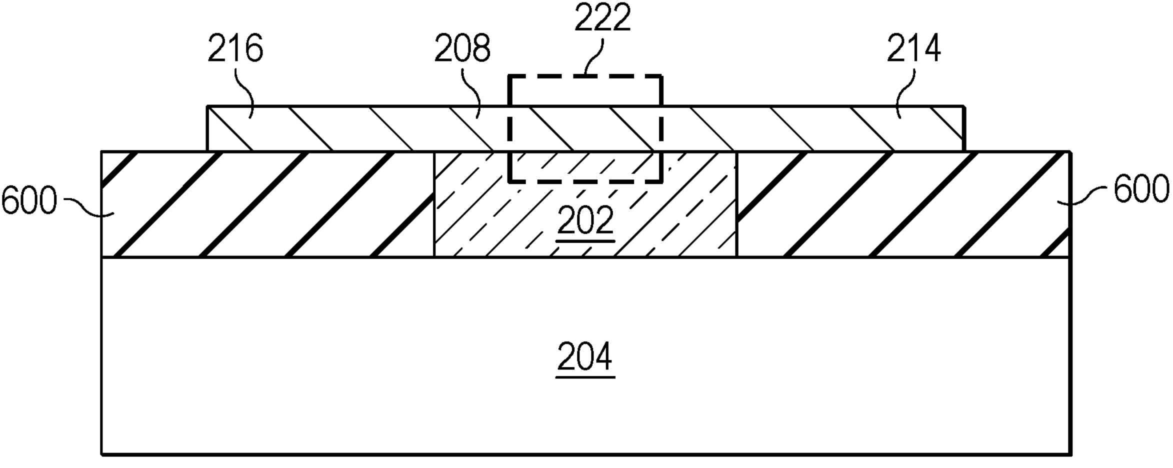
FIG. 6 is an illustration of a cross-sectional view of nanowire photodetection system in accordance with an illustrative embodiment.

Turning to FIG. 6, an illustration of a cross-sectional view of nanowire photodetection system is depicted in accordance with an illustrative embodiment. In this example, this figure shows a nanowire photodetection system 200 taken along lines 3-3 in FIG. 2 is shown.

In this example, side cladding 600 is located on either side of optical waveguide 202. Side cladding 600 at the sides of optical waveguide 202 is substantially the same height as optical waveguide 202.

Side cladding 600 can be comprised of different materials. For example, side cladding 600 can be comprised of a material with a lower refractive index than material used for optical waveguide 202. Example materials for side cladding 600 can be selected from at least one of silicon dioxide, aluminum oxide, hafnium oxide, silicon nitride, or some other material.

Although not shown, a top cladding that surrounds the superconducting material can also be included. This top cladding can be the same material or a different material as the side cladding. Side cladding 600 can be comprised of different materials. For example, side cladding 600 could be any material but preferably has a lower refractive index than the waveguide material. Such materials could be silicon dioxide, aluminum oxide, hafnium oxide, silicon nitride, or some other material.

Figure 7:
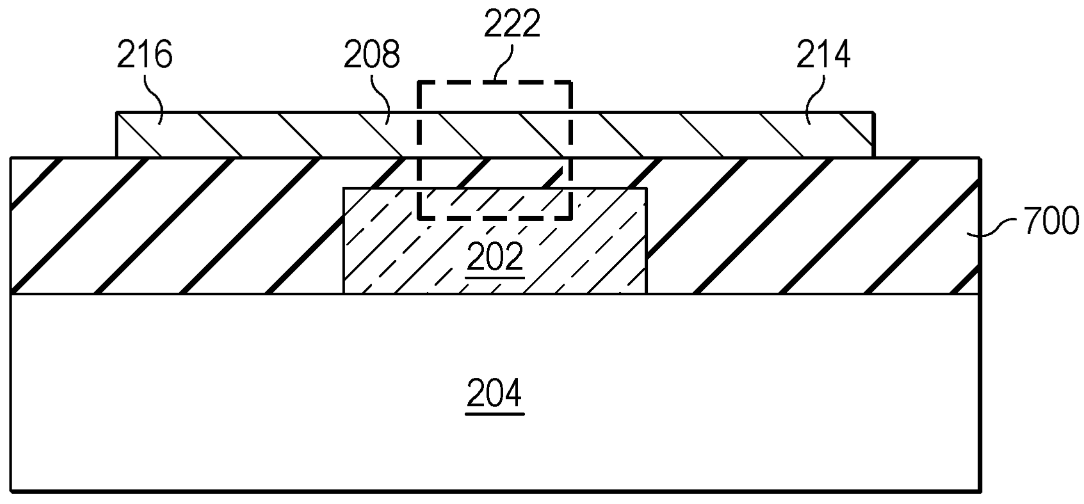
FIG. 7 is an illustration of a cross-sectional view of nanowire photodetection system in accordance with an illustrative embodiment.

With reference now to FIG. 7, an illustration of a cross-sectional view of nanowire photodetection system is depicted in accordance with an illustrative embodiment. In this example, this figure shows a nanowire photodetection system 200 taken along lines 3-3 in FIG. 2 is shown.

In this example, cladding 700 can be located on top of optical waveguide 202 in addition to being located on the sides of optical waveguide 202. This layer on top of optical waveguide 202 is located between optical waveguide 202 and superconducting material in superconducting connector wire 214, superconducting connector wire 216, and superconducting nanowire 208. This portion of cladding 700 can function as an interlayer. In other illustrative examples, a top cladding (not shown) that encompasses the superconducting material for superconducting connector wire 214, superconducting connector wire 216, and superconducting nanowire 208 can be included. This top cladding can be the same material or a different material as the cladding 700.

Figure 8:
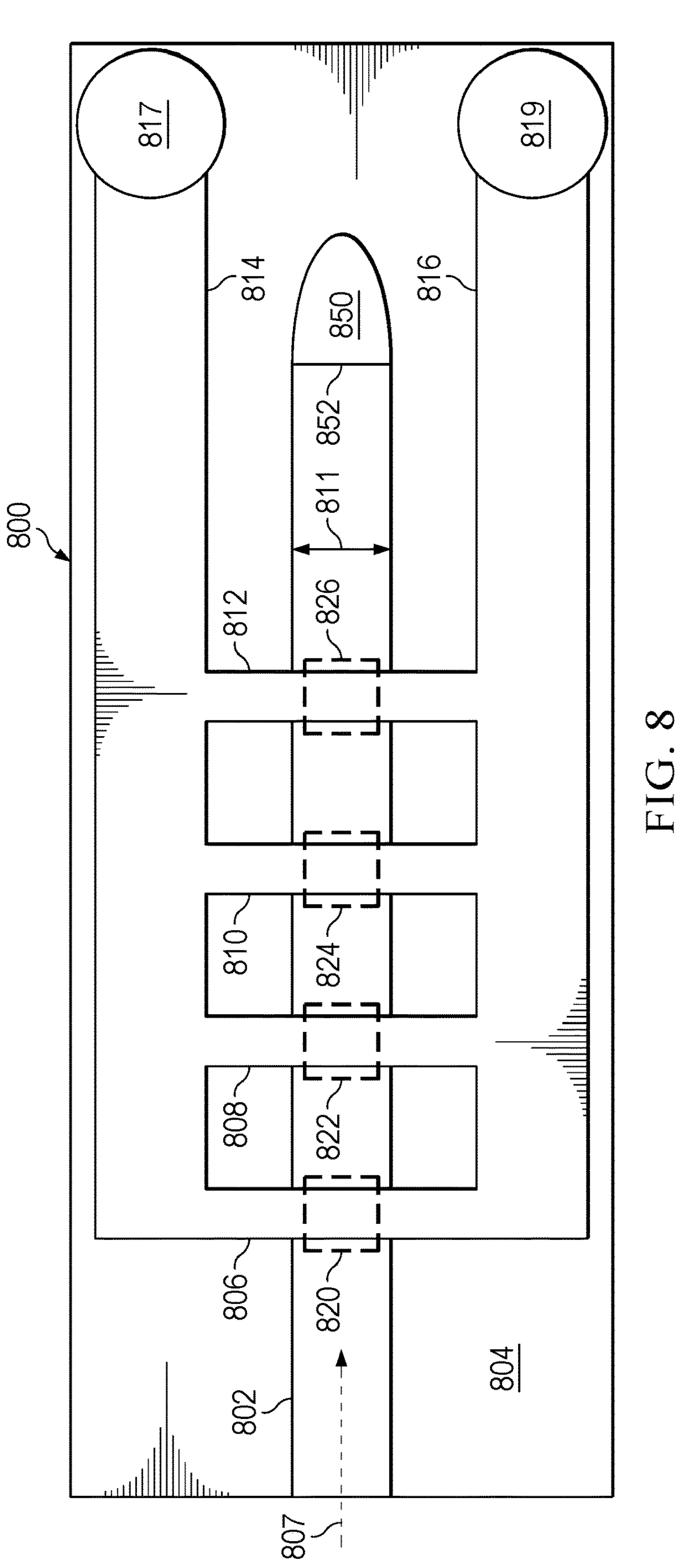
FIG. 8 is an illustration of a nanowire photodetection system in accordance with an illustrative embodiment.

With reference now to FIG. 8, an illustration of a nanowire photodetection system is depicted in accordance with an illustrative embodiment. In this illustrative example, nanowire photodetection system 800 is an example of an implementation for nanowire photodetection system 100 in FIG. 1.

As depicted, nanowire photodetection system 800 is shown in a plan view and comprises optical waveguide 802 located on substrate 804. In this example, superconducting nanowire 806, superconducting nanowire 808, superconducting nanowire 810, and superconducting nanowire 812 extend across width 811 of optical waveguide 802. These nanowires are connected in parallel to superconducting connector wire 814 and superconducting connector wire 816 located on either side of optical waveguide 802.

Superconducting connector wire 814 has contact pad 817, and superconducting connector wire 816 has contact pad 819. These contact pads can connect nanowire photodetection system 800 to other devices that can detect currents generated in response to detecting photons 807.

Further in this example, each of nanowires depicted in this example have an active sensor area. As depicted, superconducting nanowire 806 has active sensor area 820, superconducting nanowire 808 has active sensor area 822, superconducting nanowire 810 has active sensor area 824, and superconducting nanowire 812 has active sensor area 826.

In this depicted example, nanowire photodetection system 800 also comprises reflector 850. Reflector 850 in optical waveguide 802 is located after a superconducting nanowire in the superconducting nanowires in a direction of travel of a photon in optical waveguide 802. In this example, reflector 850 is located after superconducting nanowire 812.

In this example, reflector 850 is a reflective element incorporated within optical waveguide 802. By reflecting photons 807 in optical waveguide 802, additional opportunities are provided to the superconducting nanowire to absorb a photon that was not absorbed on the first pass through optical waveguide 802. As result, reflector 850 is a feature that increases the detection efficiency of nanowire photodetection system 800.

In this illustrative example, reflector 850 can be comprised of different materials. For example, reflector 850 can be selected from at least one of a reflective metal, a photonic crystal, a Bragg waveguide, or some other suitable components. Further, although depicted at end 852 of optical waveguide 802, reflector 850 can be located after selected superconducting nanowires, such as superconducting nanowire 808.

Further, one or more reflectors in addition to reflector 850 can be placed in other locations in addition to reflector 850 or in place of reflector 850. In another example, the spacing of the nanowires is designed such that the periodicity of the nanowires induces a reflection for photons of a particular wavelength. The nanowire spacing could also be apodized.

Figure 9:
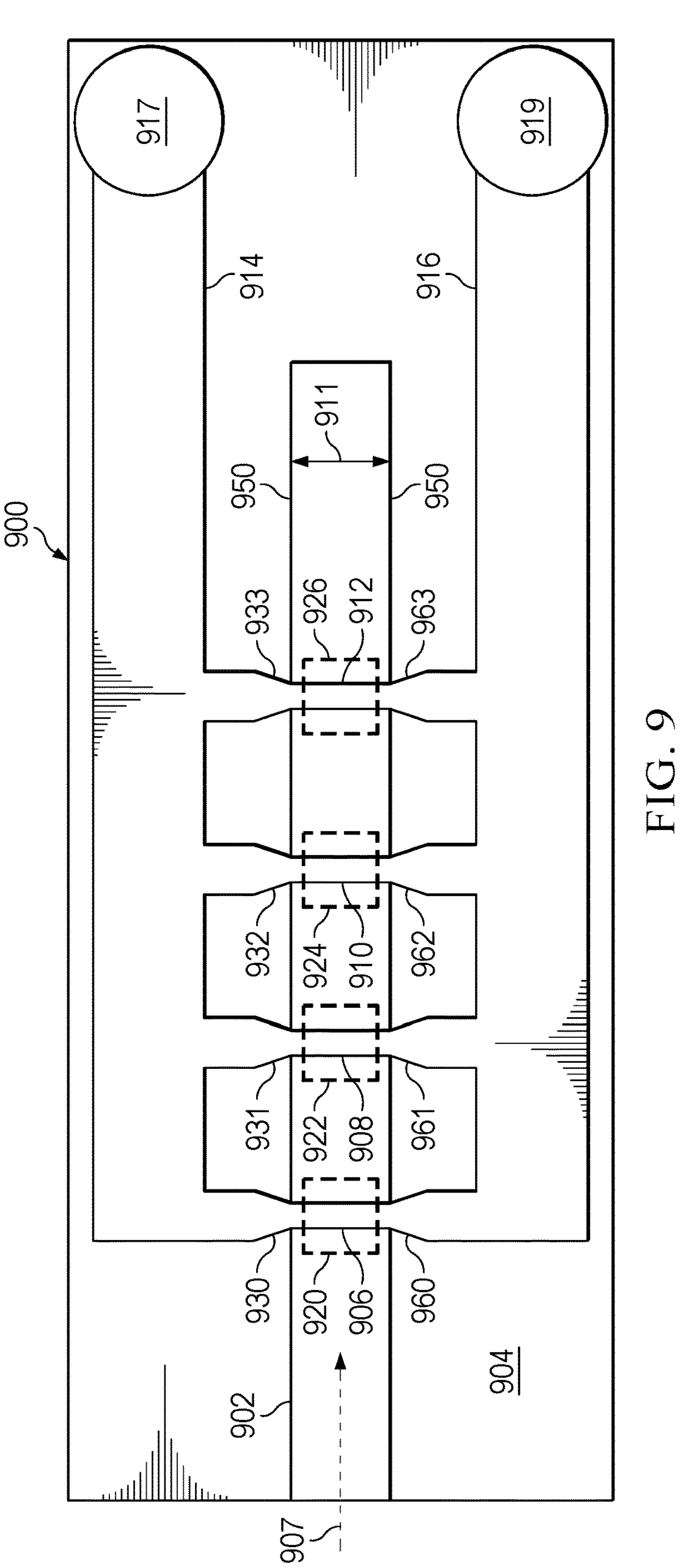
FIG. 9 is an illustration of a nanowire photodetection system in accordance with an illustrative embodiment.

With reference now to FIG. 9, an illustration of a nanowire photodetection system is depicted in accordance with an illustrative embodiment. In this illustrative example, nanowire photodetection system 900 is an example of an implementation for nanowire photodetection system 100 in FIG. 1.

As depicted, nanowire photodetection system 900 is shown in a plan view and comprises optical waveguide 902 located on substrate 904. In this example, superconducting nanowire 906, superconducting nanowire 908, superconducting nanowire 910, and superconducting nanowire 912 extend across width 911 of optical waveguide 902. These nanowires are connected in parallel to superconducting connector wire 914 and superconducting connector wire 916 located on either side of optical waveguide 902.

Superconducting connector wire 914 has contact pad 917, and superconducting connector wire 916 has contact pad 919. These contact pads can connect nanowire photodetection system 900 to other devices that can detect currents generated in response to detecting photons 907 traveling through optical waveguide 902.

Further in this example, each of nanowires depicted in this example have an active sensor area. As depicted, superconducting nanowire 906 has active sensor area 920, superconducting nanowire 908 has active sensor area 922, superconducting nanowire 910 has active sensor area 924, and superconducting nanowire 912 has active sensor area 926.

In this example, a portion of the connector wires in the form of superconducting connector wires taper in width to the superconducting nanowires. As depicted, superconducting connector wire 914 and superconducting connector wire 916 have tapers to the nanowires. In other words, the superconducting connector wires have sections that taper into the superconducting nanowires.

For example, superconducting connector wire 914 has taper 930 to superconducting nanowire 906, taper 931 to superconducting nanowire 908, taper 932 to superconducting nanowire 910, and taper 933 to superconducting nanowire 912. As depicted, superconducting connector wire 916 has taper 960 to superconducting nanowire 906, taper 961 to superconducting nanowire 908, taper 962 to superconducting nanowire 910, and taper 963 to superconducting nanowire 912.

In this illustrative example, these tapers are located near edges 950 of optical waveguide 902. In this example, these tapers transition from a wider region in the superconducting connector wires to a narrower region at the superconducting nanowires. The wider portion of a taper could be several nanometers, tens of nanometers, or hundreds of nanometers wider than a width of the superconducting nanowire.

In this illustrative example, these tapers can increase the amount of current that can flow through the superconducting material in superconducting connector wire 914 and superconducting connector wire 916 near edges 950 of optical waveguide 902. This location at or near edges 950 is a location where constrictions can be present.

These tapers can provide a similar effect to increasing the thickness of the superconducting material in superconducting connector wire 914 and superconducting connector wire 916 near edges 950 of optical waveguide 902. These tapers can be used in conjunction with conjunction with increasing the thickness of superconducting connector wire 914 and superconducting connector wire 916 at or near edges 950.

Figure 10:
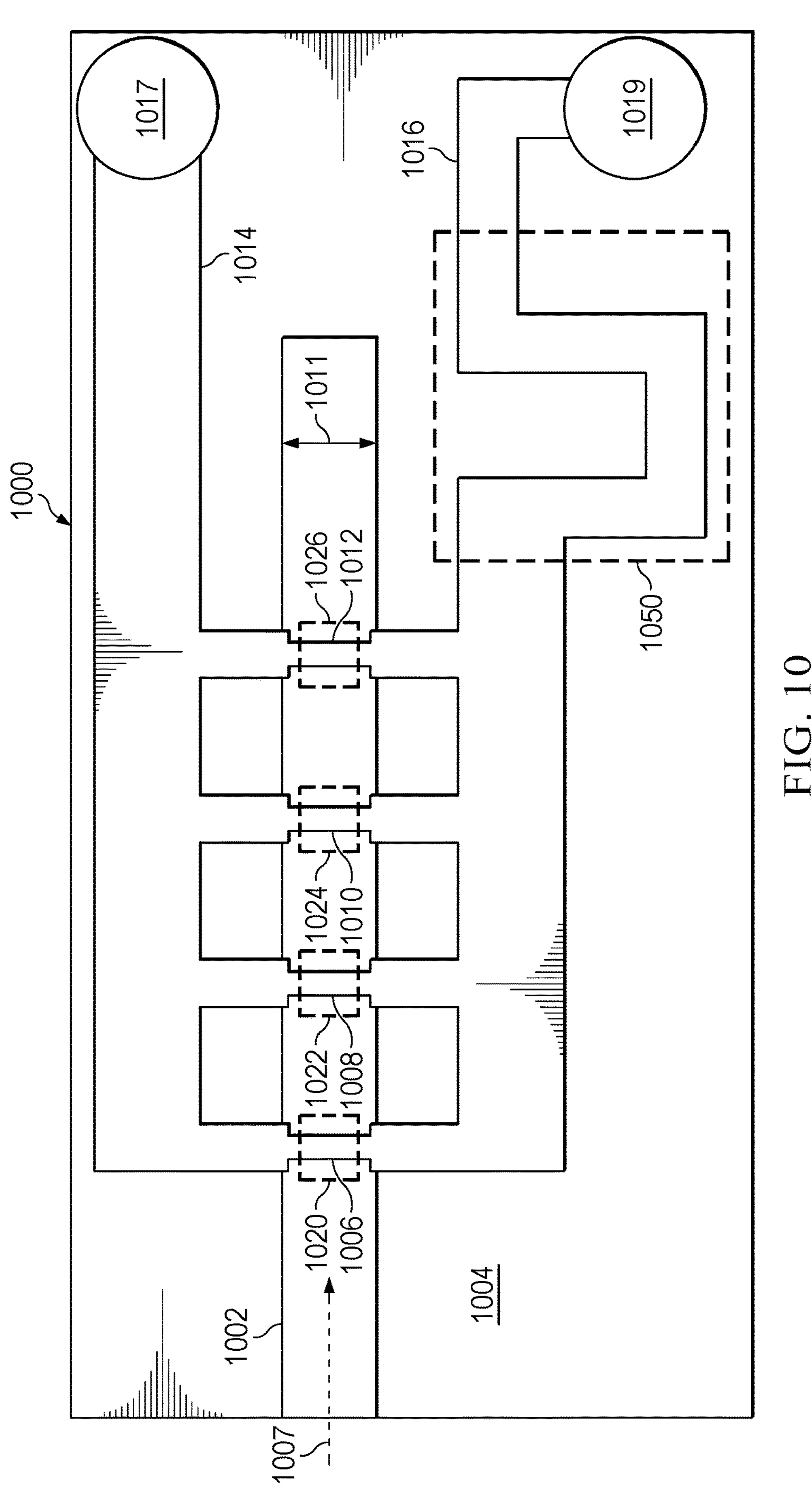
FIG. 10 is an illustration of a nanowire photodetection system in accordance with an illustrative embodiment.

With reference now to FIG. 10, an illustration of a nanowire photodetection system is depicted in accordance with an illustrative embodiment. In this illustrative example, nanowire photodetection system 1000 is an example of an implementation for nanowire photodetection system 100 in FIG. 1.

As depicted, nanowire photodetection system 1000 is shown in a plan view and comprises optical waveguide 1002 located on substrate 1004. In this example, superconducting nanowire 1006, superconducting nanowire 1008, superconducting nanowire 1010, and superconducting nanowire 1012 extend across width 1011 of optical waveguide 1002. These nanowires are connected in parallel to superconducting connector wire 1014 and superconducting connector wire 1016 located on either side of optical waveguide 1002.

Superconducting connector wire 1014 has contact pad 1017, and superconducting connector wire 1016 has contact pad 1019. These contact pads connect nanowire photodetection system 1000 to other devices that can detect currents generated in response to detecting photons 1007 traveling through optical waveguide 1002.

Further in this example, each of nanowires depicted in this example have an active sensor area. As depicted, superconducting nanowire 1006 has active sensor area 1020, superconducting nanowire 1008 has active sensor area 1022, superconducting nanowire 1010 has active sensor area 1024, and superconducting nanowire 1012 has active sensor area 1026.

As depicted, choke inductor 1050 is formed in a first superconducting connector wire, such as superconducting connector wire 1016, after a superconducting nanowire in the superconducting nanowires. Choke inductor 1050 is a type of inductor that blocks high frequency signals while allowing low frequency signals to pass. As a result, rapid or abrupt changes in current can be blocked from passing through choke inductor 1050.

In this illustrative example, choke inductor 1050 is in series with the superconducting nanowires, superconducting nanowire 1006, superconducting nanowire 1008, superconducting nanowire 1010, and superconducting nanowire 1012.

In this example, choke inductor 1050 impedes current flow such that current flows through the superconducting nanowires in response to one of the superconducting nanowires going into a normal state from detecting a photon. In other words, choke inductor 1050 aids in directing current through the superconducting nanowires still in the superconducting state rather than flowing through to contact pad 1019.

In this illustrative example, choke inductor 1050 can have an impedance that is greater than or equal to the impedance than one of the nanowires. Choke inductor 1050 aids in ensuring that an avalanche effect is triggered upon absorption of a photon in photons 1007. In this example, choke inductor 1050 forces current to redirect to the other nanowires after a nanowire goes into the normal state.

Although a single choke inductor is depicted between the nanowires and contact pad 1019, this illustration is not meant to limit the manner in which the inductors can be implemented. For example, choke inductor 1050 does not need to be comprised of a superconducting material. As another example, one or more choke inductors can be used in addition or in place of choke inductor 1050 at could be included in the invention in other locations. For example, a choke inductor could be included between each superconducting nanowire.

Figure 11:
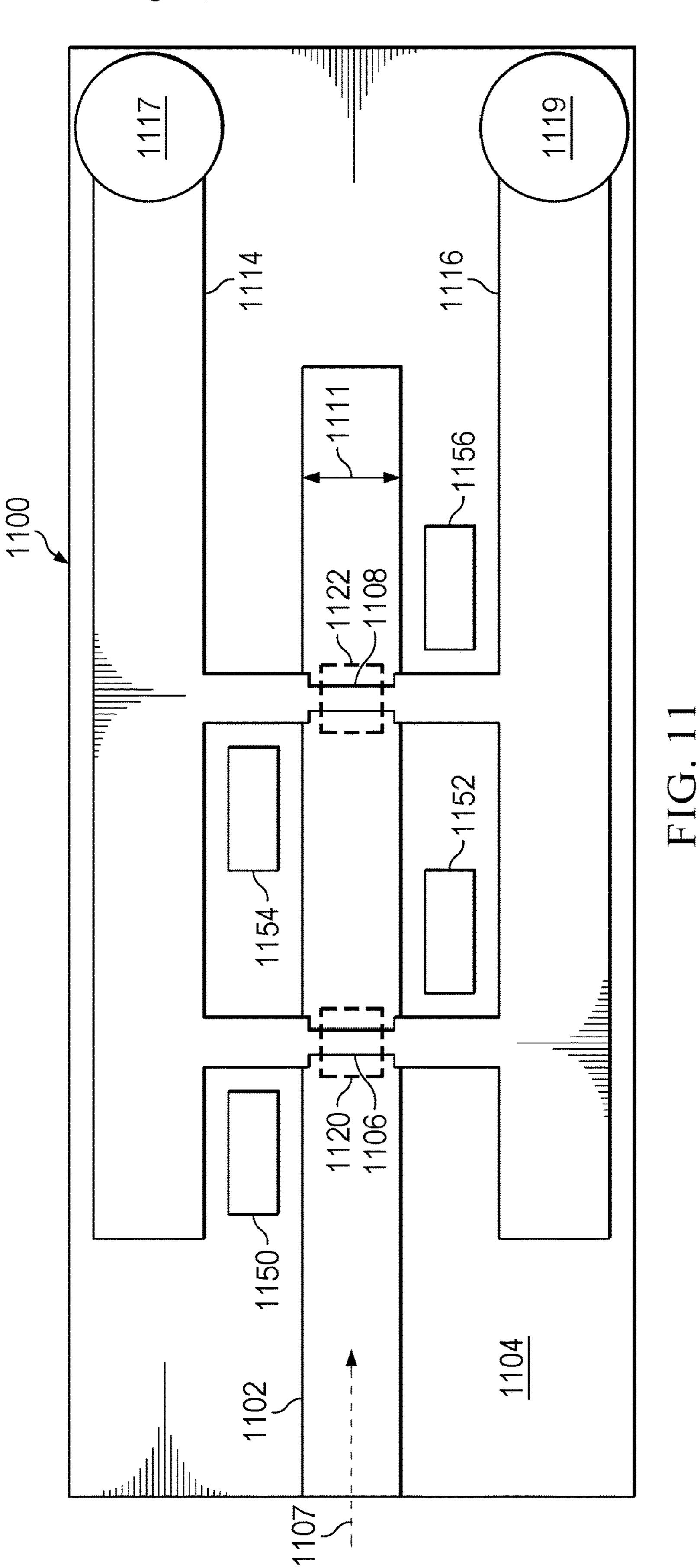
FIG. 11 is an illustration of a nanowire photodetection system with tuning electrodes in accordance with an illustrative embodiment.

Next in FIG. 11, an illustration of a nanowire photodetection system with tuning electrodes is depicted in accordance with an illustrative embodiment. In this illustrative example, nanowire photodetection system 1100 is an example of an implementation for nanowire photodetection system 100 in FIG. 1.

As depicted, nanowire photodetection system 1100 is shown in a plan view and comprises optical waveguide 1102 located on substrate 1104. In this example, superconducting nanowire 1106 and superconducting nanowire 1108 extend across width 1111 of optical waveguide 1102. These nanowires are connected in parallel to superconducting connector wire 1114 and superconducting connector wire 1116 located on either side of optical waveguide 1102.

Superconducting connector wire 1114 has contact pad 1117, and superconducting connector wire 1116 has contact pad 1119. These contact pads connect nanowire photodetection system 1100 to other devices that can detect currents generated in response to detecting photons 1007.

Further in this example, each of nanowires depicted in this example have an active sensor area. As depicted, superconducting nanowire 1106 has active sensor area 1120 and superconducting nanowire 1108 has active sensor area 1122.

In this illustrative example, nanowire photodetection system 1100 also includes tuning electrodes. As depicted, tuning electrode 1150, tuning electrode 1152, tuning electrode 1154, and tuning electrode 1156 are present in nanowire photodetection system 1100.

These tuning electrodes are positioned to generate an electric field that can encompass portions of the superconducting nanowires. For example, tuning electrode 1150 and tuning electrode 1152 are positioned relative to superconducting nanowire 1106 such that the electric field generated by these tuning electrodes can encompass at least a portion of superconducting nanowire 1106 within active sensor area 1120. In some examples, contact pad 1117 and contact pad 1119 can be configured to operate as tuning electrodes.

Also in this example, tuning electrode 1154 and tuning electrode 1156 are positioned relative to superconducting nanowire 1108. This positioning is such that the electric field generated by these tuning electrodes can encompass at least a portion of superconducting nanowire 1108 within active sensor area 1122.

In this illustrative example, the electric field generated by tuning electrode 1150 and tuning electrode 1152 can be used to change the critical current for the portion of superconducting nanowire 1106 within active sensor area 1120. In a similar fashion, tuning electrode 1154 and tuning electrode 1156 generate an electric field that can change the critical current for the portion of superconducting nanowire 1108 within active sensor area 1120.

For example, a set of tuning electrodes can be placed such that an electric field is experienced by a superconducting nanowire in the sensor active area and has a change in the critical current for that superconducting nanowire in response to a voltage bias is applied to the set of tuning electrodes. For some superconducting materials, the electric field may reduce the critical current of the nanowire. For other superconducting materials, the electric field may increase the critical current of the nanowire.

In one illustrative example, the set of tuning electrodes can be configured such that the electric field is preferably oriented perpendicular to the flow of current in the superconducting nanowire. In other examples, the set of tuning electrodes can be configured such that a smaller component of the electric field oriented perpendicular to the flow of current in the superconducting wire.

In this illustrative example, tuning electrodes can be placed to avoid absorbing photons 1107 from optical waveguide 1102. The placement can also be to increase the electric field in the active sensor area for a given applied voltage bias.

The set of tuning electrodes in nanowire photodetection system 1100 can be used to ensure that the critical current for the portions of the superconducting nanowires in the active sensor areas are as close to each other as possible. In some illustrative examples, the tuning electrodes are configured and operated to increase the critical current in at least one of the nanowires.

This adjustment of the critical current using the tuning electrodes can increase the likelihood that the absorption of a photon in by a superconducting nanowire in the active sensor area triggers the avalanche effect. This kind of adjustment can make an avalanche effect more likely even though differences in constrictions are present among the individual superconducting nanowires.

The use of tuning electrodes enables individually setting current of the superconducting nanowires such that an applied current can be set closer to the critical current without causing the portions of the superconducting nanowires in the active sensor regions to shift into a normal state from the superconducting state. This avoids having some of the superconducting nanowires moving into a normal state because of constrictions.

In these illustrative examples, setting the critical current of each superconducting nanowire to be approximately equal enables the occurrence of an avalanche effect in response to a photon is absorbed by one of the superconducting nanowire in active sensor area. The use of tuning electrodes also enables a configuration in which individual superconducting nanowires do not have the same or equal geometry. In other words, the intrinsic critical current of the superconductor nanowires can be different, and nanowire photodetection system 1100 can perform as desired with the use of tuning electrodes and adjust for bias make critical currents for the superconducting nanowires to be approximately the same or equal.

Further, tuning electrodes can be configured to turn off active sensor areas in nanowire photodetection system 1100. For example, specific superconducting nanowires placed into a normal state through changing the critical current for those superconducting nanowires. This operation can be performed by raising the critical current of particular superconducting nanowires, while keeping critical current of other superconducting nanowires low. In another example, the critical current of selected particular superconducting nanowires can be set lower, while keeping the critical current for other superconducting nanowires are high.

This setting of critical currents for different superconducting nanowires relative to other superconducting nanowires can be used to determine the approximate critical current of each superconducting nanowire after fabrication of nanowire photodetection system 1100. This type of operation can be performed to determine the critical current for superconducting nanowires in nanowire photodetection system 1100 such that the voltage is applied by the tuning electrodes can be set for actual optimal operation of nanowire photodetection system 1100 to absorb photons.

This illustrative example illustrates the use of two tuning electrodes for each of the superconducting nanowires. Other illustrative examples can use other numbers of tuning electrodes. For example, a single tuning electrode, three tuning electrodes, or some other number of tuning electrodes can be used to adjust the critical current for a superconducting nanowire. Further, in some illustrative examples, one superconducting nanowire may have a set of tuning electrodes while another superconducting nanowire may not have any tuning electrodes.

With reference to FIGS. 12-15, examples of cross-sections of superconducting nanowires with tuning electrodes are depicted in accordance with an illustrative embodiment. These cross-sections are examples of cross-sections that can be implemented in a nanowire photodetection system to enable biasing the group current for a superconducting nanowire.

Figure 12:
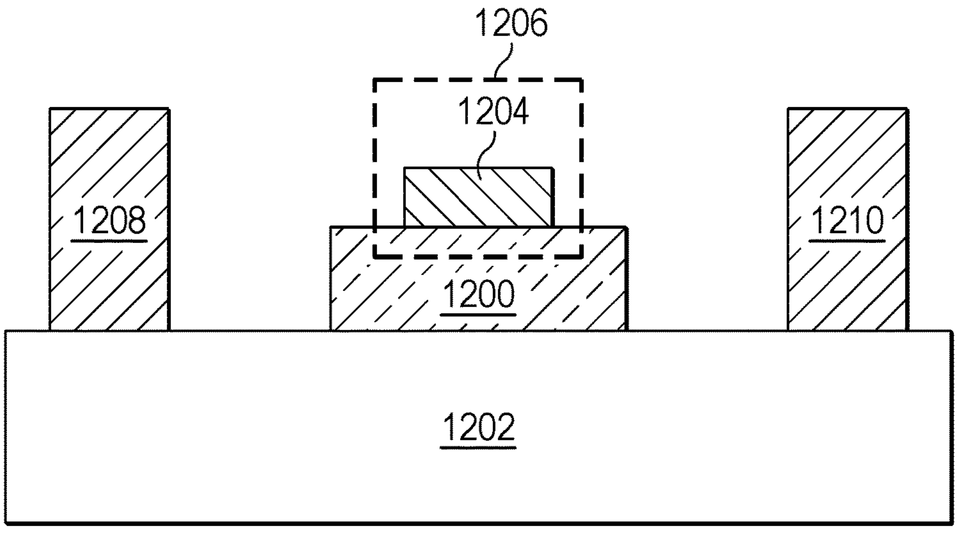
FIG. 12 is an illustration of a cross-sectional view of superconducting nanowires and tuning electrodes were detecting photons in an optical waveguide in accordance with an illustrative embodiment.

Turning first to FIG. 12, an illustration of a cross-sectional view of superconducting nanowires and tuning electrodes where detecting photons in an optical waveguide is depicted in accordance with an illustrative embodiment. In this illustrative example, optical waveguide 1200 is located on substrate 1202. Superconducting nanowire 1204 is located on a portion of optical waveguide 1200 and has active sensor area 1206.

As depicted, tuning electrode 1208 and tuning electrode 1210 are positioned on either side of optical waveguide 1200. Further, these tuning electrodes are positioned on either side of superconducting nanowire 1204. This positioning may not be directly adjacent to superconducting nanowire 1204. The positioning of these tuning electrodes are on such that the electric field generated by the tuning electrodes can change the critical current for the portion of superconducting nanowire 1204 within active sensor area 1206.

The tuning electrodes in the cross-section illustrated can generate an electric field that extends into active sensor area 1206. Additionally, these tuning electrodes can generate an electric field that extends into other superconducting material in superconducting nanowire 1204. This electric field can also be extended into other components.

In configuring the dimensions and locations of tuning electrode 1208 and tuning electrode 1210, the configuration can be such that when the electric field extends into other regions of the superconducting material of superconducting nanowire 1204 out of active sensor area 1206, the electric field does not reduce the critical current of those sections to be less than or approximately equal to the critical current of the nanowire in active sensor area 1206.

In some illustrative examples, the critical current of superconducting nanowire 1204 can be modulated by an electric field that does not appreciably overlap with active sensor area 1206. Instead, the electric field can predominately interact with some other region of the superconducting material of superconducting nanowire 1204 outside of active sensor area 1206.

Further, in some illustrative examples a portion of these tuning electrodes can be located at approximately the same height (direction perpendicular to the plane of the substrate) as superconducting nanowire 1204. In other illustrative examples, a portion of the tuning electrodes are not located at approximately the same height as superconducting nanowire 1204.

Figure 13:
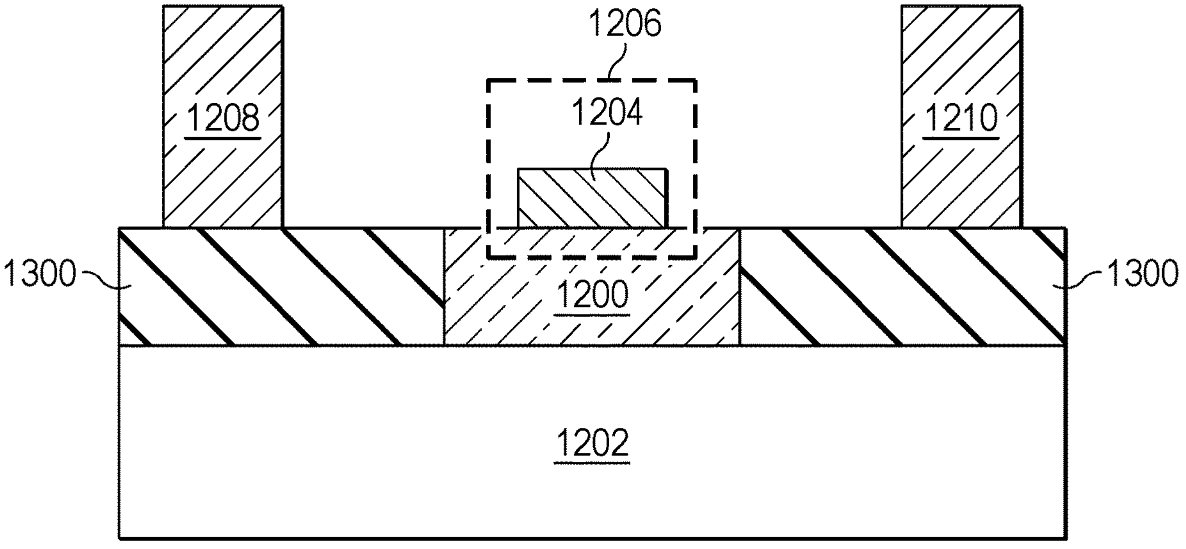
FIG. 13 is an illustration of a cross-sectional view of superconducting nanowires and tuning electrodes used to absorb photons in an optical waveguide in accordance with an illustrative embodiment.

Turning next to FIG. 13, an illustration of a cross-sectional view of superconducting nanowires and tuning electrodes used to absorb photons in an optical waveguide is depicted in accordance with an illustrative embodiment.

In this cross-sectional view, tuning electrode 1208 and tuning electrode 1210 are located on cladding 1300. Cladding 1300 provides a planar surface with optical waveguide 1200. With cladding 1300, fewer changes in height or geometry are needed for superconducting nanowires and superconducting connector wires.

Figures 14, 15:
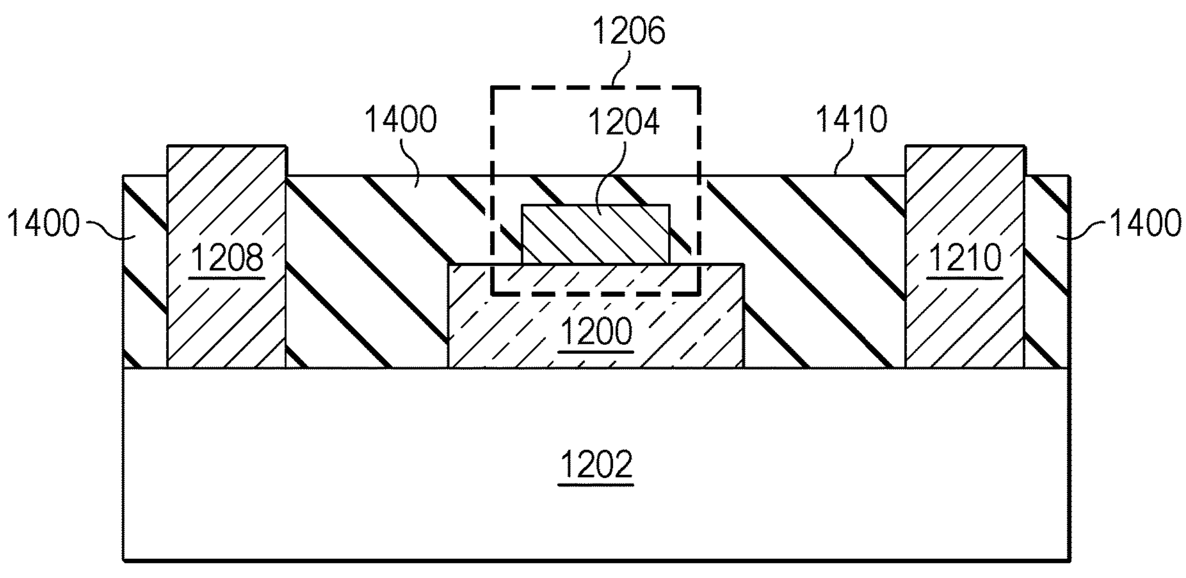
FIG. 14 is an illustration of a cross-sectional view of superconducting nanowires and tuning electrodes used to absorb photons in an optical waveguide in accordance with an illustrative embodiment.
FIG. 15 is an illustration of a cross-sectional view of superconducting nanowires and tuning electrodes used to absorb photons in an optical waveguide in accordance with an illustrative embodiment.

In FIG. 14, another illustration of a cross-sectional view of superconducting nanowires and tuning electrodes used to absorb photons in an optical waveguide is depicted in accordance with an illustrative embodiment. In this illustrative example, cladding 1400 is present and has dimensions such that a portion of tuning electrode 1208 and tuning electrode 1210 extend above surface 1410 of cladding 1400.

In this example, only a portion of tuning electrode 1208 and tuning electrode 1210 protrude above surface 1410 of cladding 1400. Other portions of tuning electrode 1208 and tuning electrode 1210 are completely buried in cladding 1400. In some illustrative examples, tuning electrode 1208 and tuning electrode 1210 may not extend to contact substrate 1202. The exposed portion of tuning electrode 1208 and tuning electrode 1210 provide an ability to make electrical contacts to these tuning electrodes.

Turning now to FIG. 15, another illustration of a cross-sectional view of superconducting nanowires and tuning electrodes used to absorb photons in an optical waveguide is depicted in accordance with an illustrative embodiment. In this example, the cross-section from 1400 now includes tuning electrode 1500.

The use of more than two tuning electrodes can enable greater control of the electric field applied in active sensor area 1206 of superconducting nanowire 1204. Further, in addition to controlling the extent of the electric field, the direction of the electric field can be controlled. For example, an electric field can be applied with the majority of its electric field strength pointing in a direction perpendicular to the plane of substrate 1202. In another example, the tuning electrodes can apply an electric field with the majority of its electric field strength pointing in the direction parallel to the plane of substrate 1202.

In yet another example, the generation of the electric field by these tuning electrodes can be such that the electric field is oriented in an arbitrary direction. Although three tuning electrodes are shown in this example, other numbers of tuning electrodes can be used in other examples.

Figure 16:
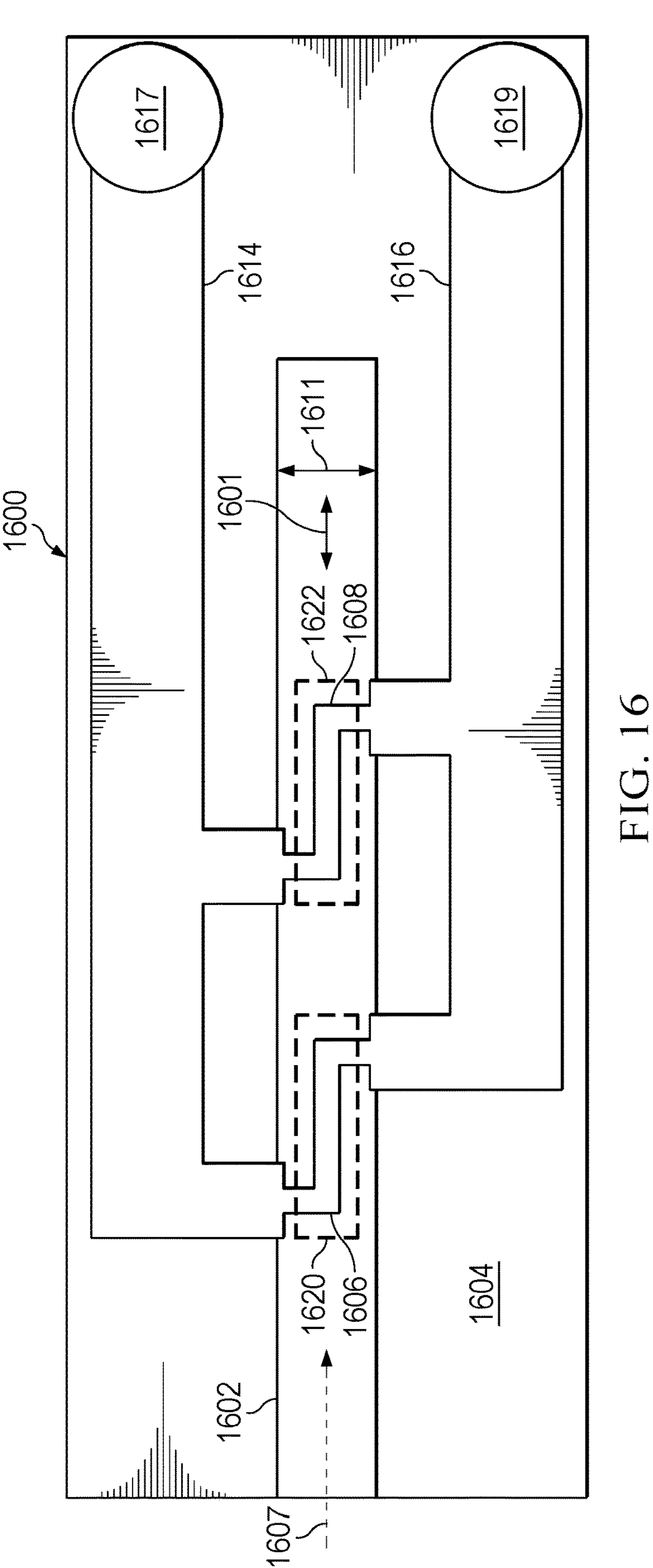
FIG. 16 is an illustration of a nanowire photodetection system with superconducting nanowires extending in the direction of the optical waveguide in accordance with an illustrative embodiment.

With reference to FIG. 16, an illustration of a nanowire photodetection system with superconducting nanowires extending in the direction of the optical waveguide is depicted in accordance with an illustrative embodiment. In this illustrative example, nanowire photodetection system 1600 is an example of an implementation for nanowire photodetection system 100 in FIG. 1.

As depicted, nanowire photodetection system 1600 is shown in a plan view and comprises optical waveguide 1602 located on substrate 1604. In this example, superconducting nanowire 1606 and superconducting nanowire 1608 extend across width 1611 of optical waveguide 1602. These nanowires are connected in parallel to superconducting connector wire 1614 and superconducting connector wire 1616 located on either side of optical waveguide 1602.

As depicted in this example, superconducting nanowire 1606 and superconducting nanowire 1608 extend across optical waveguide 1602. However, these superconducting nanowires do not extend directly across optical waveguide 1602. Instead, a portion of the superconducting nanowires extend in a direction parallel to the direction of the waveguide and propagation direction of photons in the waveguide as indicated by arrow 1601. This configuration of these superconducting nanowires increases the probability that a photon in photons 1607 is absorbed by one of the nanowires. In this example, the bends in these superconducting nanowires could be abrupt changes in direction or gradual changes in direction. Further, in other illustrative examples, a taper is also included in one or more portions of the bends.

Further in this example, each of the nanowires depicted in this example have an active sensor area. As depicted, superconducting nanowire 1606 has active sensor area 1620 and superconducting nanowire 1608 has active sensor area 1622.

Superconducting connector wire 1614 has contact pad 1617, and superconducting connector wire 1616 has contact pad 1619. These contact pads connect nanowire photodetection system 1600 to other devices that can detect currents generated in response to detecting photons 1607 traveling through optical waveguide 1602.

Figure 17:
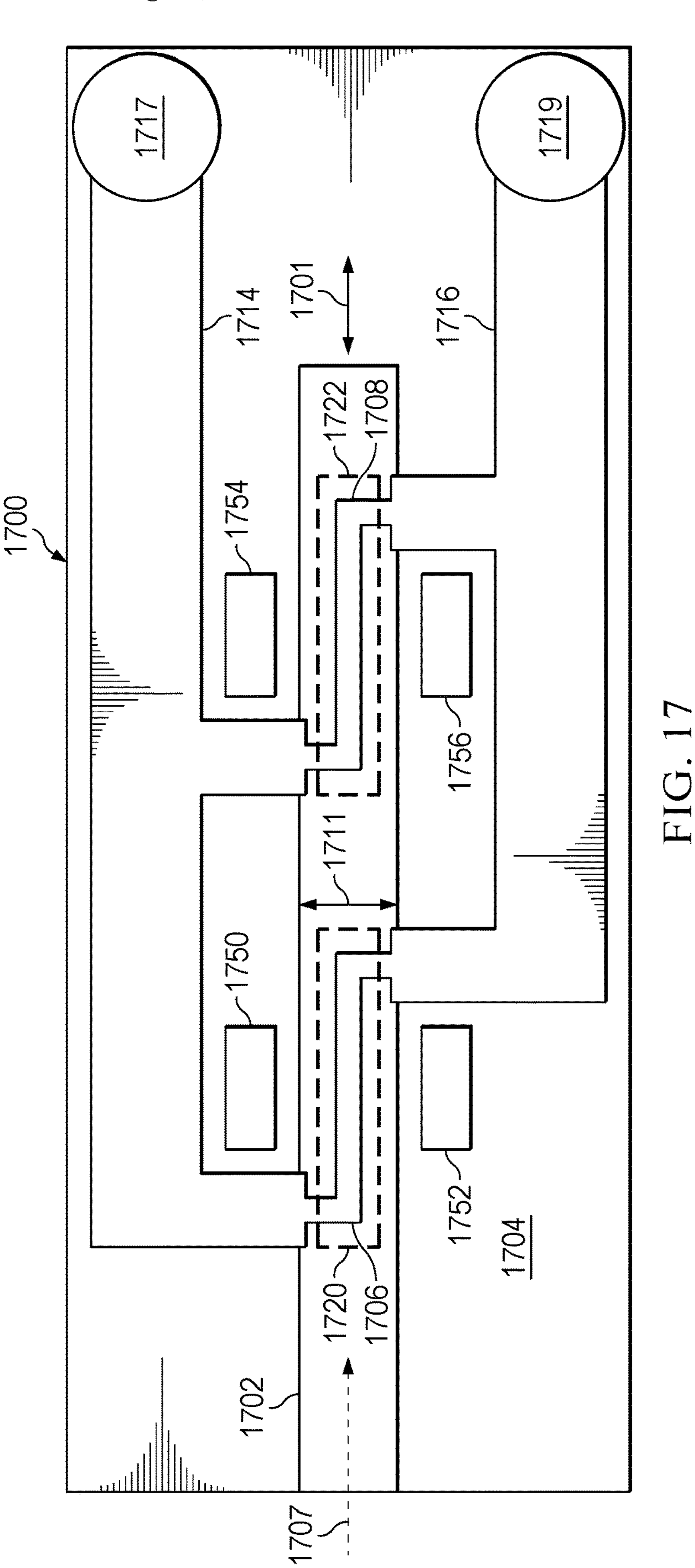
FIG. 17 is an illustration of a nanowire photodetection system with superconducting nanowires extending in the direction of the optical waveguide in accordance with an illustrative embodiment.

With reference to FIG. 17, an illustration of a nanowire photodetection system with superconducting nanowires extending in the direction of the optical waveguide is depicted in accordance with an illustrative embodiment. In this illustrative example, nanowire photodetection system 1700 is an example of an implementation for nanowire photodetection system 100 in FIG. 1.

As depicted, nanowire photodetection system 1700 is shown in a plan view and comprises optical waveguide 1702 located on substrate 1704. In this example, superconducting nanowire 1706 and superconducting nanowire 1708 extend across width 1711 of optical waveguide 1702. These nanowires are connected in parallel to superconducting connector wire 1714 and superconducting connector wire 1716 located on either side of optical waveguide 1702. In this example, superconducting connector wire 1714 is connected to contact pad 2917, and superconducting connector wire 1716 is connected to contact pad 2219.

In this example, a portion of a superconducting nanowire extends in the direction of travel of a photon in photons 1707 in optical waveguide 1702 as indicated by arrow 1701. Further in this example, each of the nanowires depicted in this example have an active sensor area. As depicted, superconducting nanowire 1706 has active sensor area 1720 and superconducting nanowire 1708 has active sensor area 1722. Photons 1707 traveling through optical waveguide 1702 can be absorbed by portions of the superconducting nanowires in these active sensor areas.

In this illustrative example, nanowire photodetection system 1700 also includes tuning electrodes. As depicted, tuning electrode 1750, tuning electrode 1752, tuning electrode 1754, and tuning electrode 1756 are present in nanowire photodetection system 1700.

These tuning electrodes are positioned to generate an electric field that can encompass portions of the superconducting nanowires. For example, tuning electrode 1750 and tuning electrode 1752 are positioned relative to superconducting nanowire 1706 such that the electric field generated by these tuning electrodes can encompass at least a portion of superconducting nanowire 1706 within active sensor area 1720.

Also in this example, tuning electrode 1754 and tuning electrode 1756 are positioned relative to superconducting nanowire 1708. This positioning is such that the electric field generated by these tuning electrodes can encompass at least a portion of superconducting nanowire 1708 within active sensor area 1722.

Figure 18:
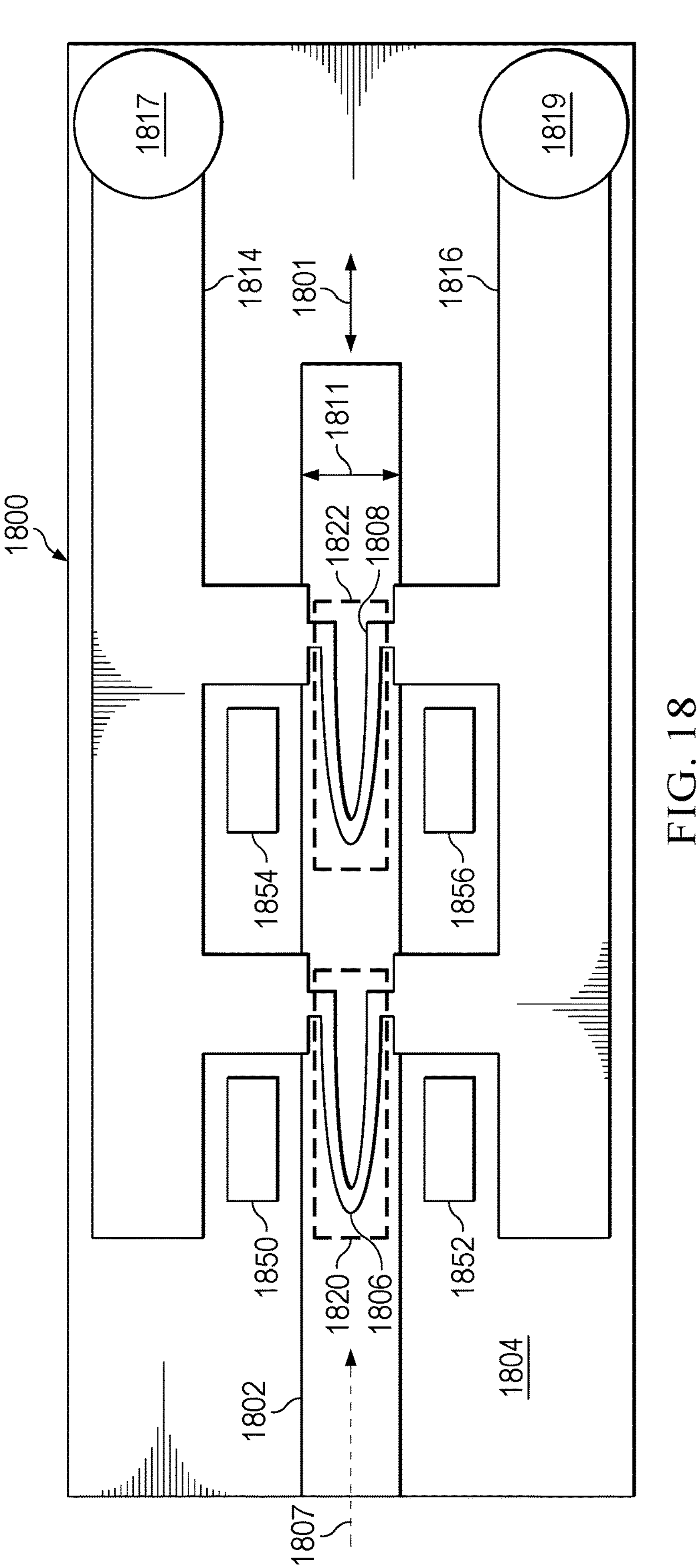
FIG. 18 is an illustration of a nanowire photodetection system with superconducting nanowires extending in the direction of the optical waveguide in accordance with an illustrative embodiment.

With reference to FIG. 18, an illustration of a nanowire photodetection system with superconducting nanowires extending in the direction of the optical waveguide is depicted in accordance with an illustrative embodiment. In this illustrative example, nanowire photodetection system 1800 is an example of an implementation for nanowire photodetection system 100 in FIG. 1.

As depicted, nanowire photodetection system 1800 is shown in a plan view and comprises optical waveguide 1802 located on substrate 1804. In this example, superconducting nanowire 1806 and superconducting nanowire 1808 extend across width 1811 of optical waveguide 1802. These nanowires are connected in parallel to superconducting connector wire 1814 and superconducting connector wire 1816 located on either side of optical waveguide 1802.

In this example, at least two portions of each of the superconducting nanowires extend in a direction that is in the direction of the waveguide and propagation direction of photons in the waveguide as indicated by arrow 1801. This configuration of superconducting nanowire 1806 and superconducting nanowire 1808 further increases the probability that a photon in photons 1807 will be detected by one of the superconducting nanowires.

Further in this example, each of the nanowires depicted in this example have an active sensor area. As depicted, superconducting nanowire 1806 has active sensor area 1820 and superconducting nanowire 1808 has active sensor area 1822.

In this illustrative example, nanowire photodetection system 1800 also includes tuning electrodes. As depicted, tuning electrode 1850, tuning electrode 1852, tuning electrode 1854, and tuning electrode 1856 are present in nanowire photodetection system 1800.

These tuning electrodes are positioned to generate an electric field that can encompass portions of the superconducting nanowires. For example, tuning electrode 1850 and tuning electrode 1852 are positioned relative to superconducting nanowire 1806 such that the electric field generated by these tuning electrodes can encompass at least a portion of superconducting nanowire 1806 within active sensor area 1820.

Also in this example, tuning electrode 1854 and tuning electrode 1856 are positioned relative to superconducting nanowire 1808. This positioning is such that the electric field generated by these tuning electrodes can encompass at least a portion of superconducting nanowire 1808 within active sensor area 1822.

Figure 19:
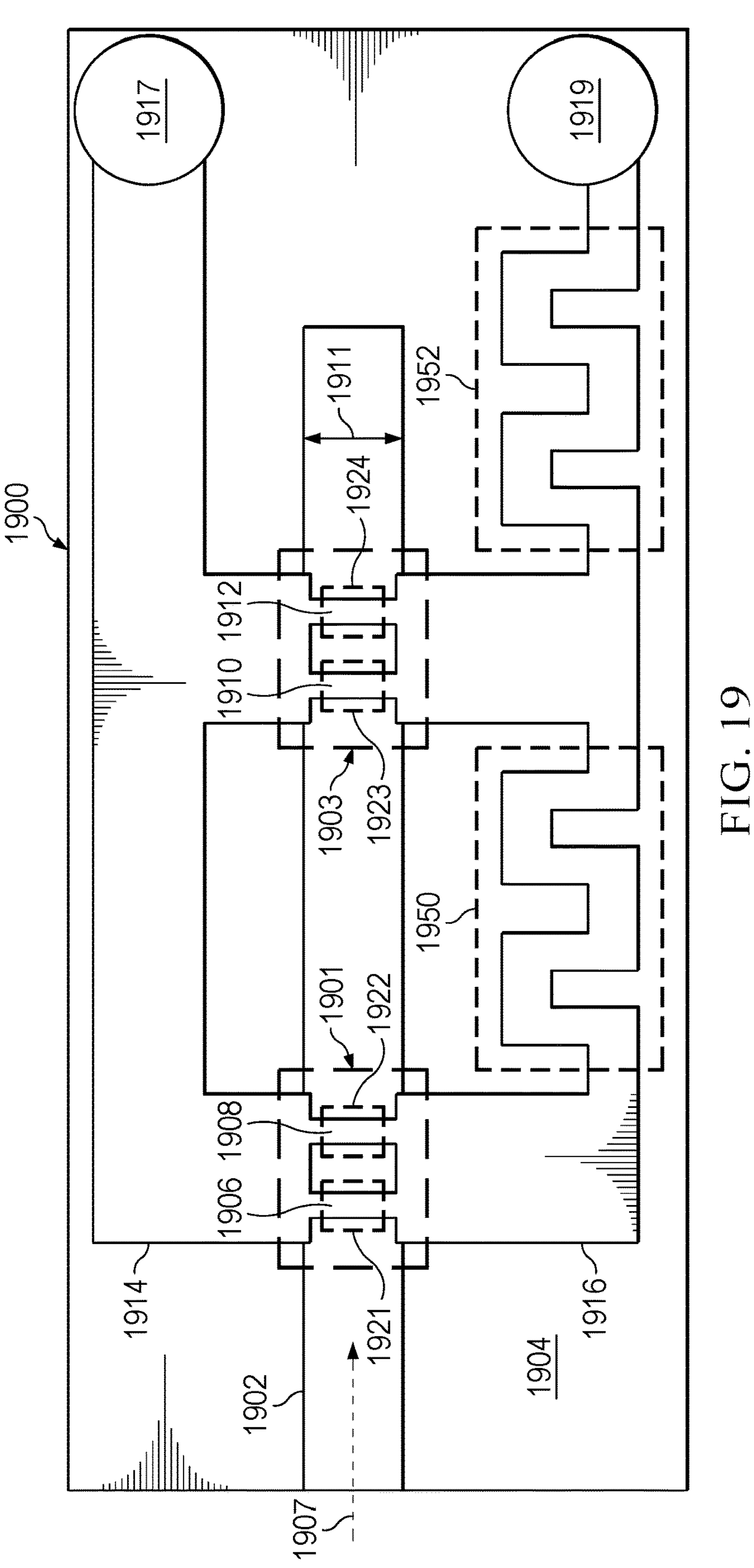
FIG. 19 is an illustration of a nanowire photodetection system using stages of superconducting nanowires in accordance with an illustrative embodiment.

With reference now to FIG. 19, an illustration of a nanowire photodetection system using stages of superconducting nanowires is depicted in accordance with an illustrative embodiment. In this illustrative example, nanowire photodetection system 1900 is an example of an implementation for nanowire photodetection system 100 in FIG. 1.

As depicted, nanowire photodetection system 1900 is shown in a plan view and comprises optical waveguide 1902 located on substrate 1904. In this example, superconducting nanowire 1906, superconducting nanowire 1908, superconducting nanowire 1910, and superconducting nanowire 1912 extend across width 1911 of optical waveguide 1902. These nanowires are connected in parallel to superconducting connector wire 1914 and superconducting connector wire 1916 located on either side of optical waveguide 1902. More specifically, the superconducting nanowires are electrically connected in parallel by having first ends connected to a first superconducting connector wire, superconducting connector wire 1914, and second ends connected to a second superconducting connector wire, superconducting connector wire 1916.

First superconducting connector wire 1914 has contact pad 1917, and second superconducting connector wire 1916 has contact pad 1919. These contact pads connect nanowire photodetection system 1900 to other devices that can detect currents generated in response to detecting photons 1907 traveling through optical waveguide 1902.

Further in this example, active sensor areas are present for pairs of nanowires. Each of these pairs of superconducting nanowires forms a stage for detecting photons 1907. The active sensor area for each stage encompasses an area over width 1911 of optical waveguide 1902.

For example, first stage 1901 comprises superconducting nanowire 1906 having active sensor area 1921 and superconducting nanowire 1908 having active sensor area 1922. Second stage 1903 comprises superconducting nanowire 1910 and has active sensor area 1923 and superconducting nanowire 1910 and has active sensor area 1924. In this illustrative example, the superconducting nanowires are configured in stages such that more than one avalanche effect occurs after absorption of a photon. Upon absorption of a photon by a first superconducting nanowire, such as superconducting nanowire 1906, in first stage 1901, that nanowire goes into a normal state with increased resistance. The applied current that was flowing across the two nanowires in first stage 1901 is then directed by choke inductor 1950 to flow through superconducting nanowire 1908, which is less resistive in a superconducting state.

With the increase of current suddenly forced through the superconducting nanowire 1908 in first stage 1901, the current flow through superconducting nanowire 1908 exceeds the critical current for superconducting nanowire 1908. As result, superconducting nanowire 1908 changes from a superconductive state to a normal state with increased resistivity. The applied current that was flowing through first stage 1901 is now redirected by choke inductor 1952 to second stage 1903. The increase in current in second stage 1903 causes the current flow through those superconducting nanowires to exceed critical current. As a result, the superconducting nanowires change from the superconducting state to a normal state.

Thus, an abrupt change in resistance is experienced in all the different stages and a voltage pulse is generated that can be detected. This voltage pulse indicates the detection of a photon.

Although two stages are depicted, other illustrative examples can include one or more stages in addition to these two stages. Further, each stage can include two or more superconducting nanowires. In other illustrative examples, tuning electrodes could be used with around one or more of the nanowires in one or more of the stages to adjust the critical currents of those superconducting nanowires.

In this example, additional components such as first choke inductor 1950 and second choke inductor 1952 can be used in conjunction with first stage 1901 and second stage 1903. In this example, first choke inductor 1950 and second choke inductor 1952 are formed in a first superconducting connector wire, such as superconducting connector wire 1916. In this example, first choke inductor 1950 connects first stage 1901 to second stage 1903. Second choke inductor 1952 is connected to second stage 1903 and connects second stage to contact pad 1919.

These choke inductors can aid in directing flow through the different stages to increase avalanche events. For example, first choke inductor 1950 can impede the flow of current into second stage 1903 from first stage 1901 response to changes in resistivity caused by a superconducting nanowire in first stage 1901 detecting a photon. Second choke inductor 1952 can impede the flow of current to contact pad 1919 in response to changes in resistivity by a superconducting nanowire in second stage 1903 detecting a photon in photons 1907 traveling through optical waveguide 1902.

Figure 20:
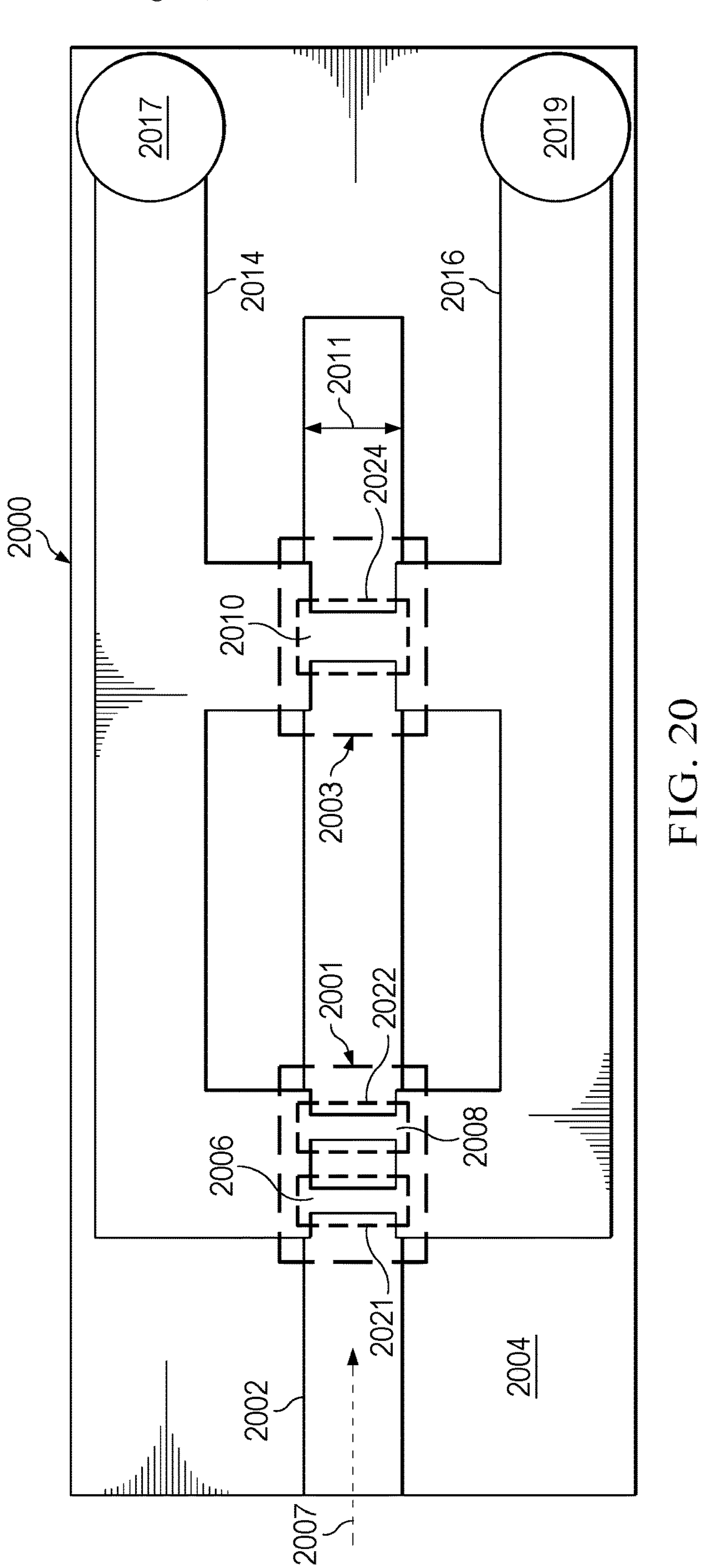
FIG. 20 is an illustration of a nanowire photodetection system using stages of superconducting nanowires in accordance with an illustrative embodiment.

With reference now to FIG. 20, an illustration of a nanowire photodetection system using stages of superconducting nanowires is depicted in accordance with an illustrative embodiment. In this illustrative example, nanowire photodetection system 2000 is an example of an implementation for nanowire photodetection system 100 in FIG. 1.

As depicted, nanowire photodetection system 2000 is shown in a plan view and comprises optical waveguide 2002 located on substrate 2004. In this example, superconducting nanowire 2006, superconducting nanowire 2008, and superconducting nanowire 2010 extend across width 2011 of optical waveguide 2002. These nanowires are connected in parallel to superconducting connector wire 2014 and superconducting connector wire 2016 located on either side of optical waveguide 2002. More specifically, the superconducting nanowires are electrically connected in parallel by having first ends connected to a first superconducting connector wire, superconducting connector wire 2014, and second ends connected to a second superconducting connector wire, superconducting connector wire 2016.

First superconducting connector wire 2014 has contact pad 2017, and second superconducting connector wire 2016 has contact pad 2019. These contact pads connect nanowire photodetection system 2000 to other devices that can detect currents generated in response to detecting photons 2007 traveling through optical waveguide 2002.

Further in this example, active sensor areas are present for individual nanowires. Each of these pairs of superconducting nanowires forms a stage for detecting photons 2007. The active sensor areas in each of the stages encompasses an area over width 2011 of optical waveguide 2002.

In this example, first stage 2001 comprises a first number of superconducting nanowires crossing optical waveguide 2002, wherein the first number of the superconducting nanowires has a first number of active sensor areas. For example, first stage 2001 comprises superconducting nanowire 2006 that has active sensor area 2021 and superconducting nanowire 2008 that has active sensor area 2022.

Second stage 2003 comprises a second number of the superconducting nanowires crossing optical waveguide 2002, wherein the second number of the superconducting nanowires has a second number of active sensor areas. In a second active sensor area, active sensor area 2020. Second stage 2003 comprises superconducting nanowire 2010 that has active sensor area 2024.

As depicted in this example, first stage 2001 has a different number of superconducting nanowires from second stage 2003. In this example, the second number of superconducting nanowires is less than or equal to the first number of superconducting nanowires.

In other illustrative examples, set of tuning electrodes can be used with any number of the superconducting nanowires in any of the stages. In the illustrative example, the critical current of each stage, considered as the set of nanowires comprised in the stage rather than critical current of each individual nanowire, is set to be substantially equal.

In addition, tuning electrodes could be used around various nanowires in order to modulate the critical current of each stage such that the different stages each have the same critical current. This is in contrast to having the same critical current on a per superconducting nanowire basis.

Figure 21:
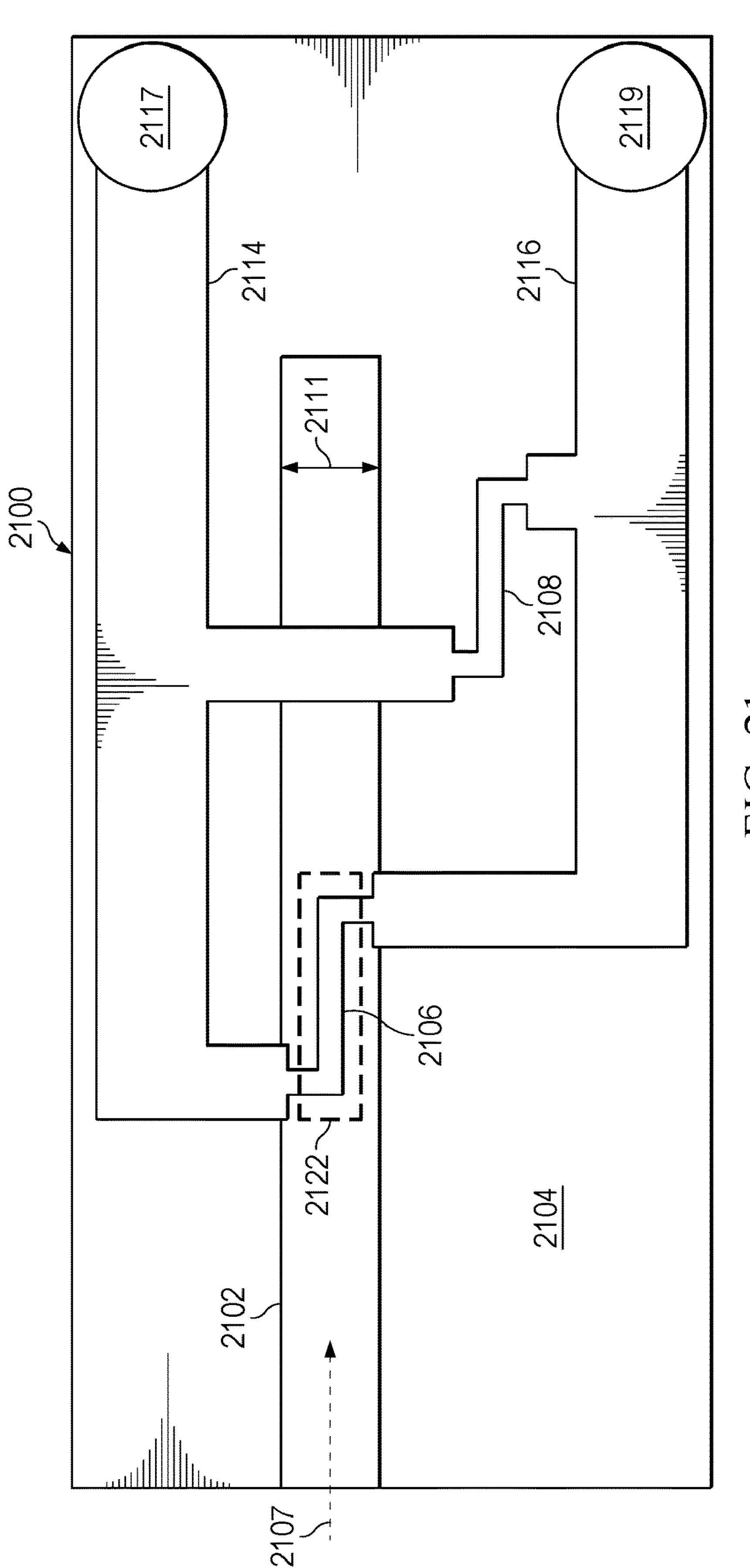
FIG. 21 is an illustration of a nanowire photodetection system with a portion of the superconducting nanowires not overlapping the optical waveguide in accordance with an illustrative embodiment.

Next in FIG. 21, an illustration of a nanowire photodetection system with a portion of the superconducting nanowires not overlapping the optical waveguide is depicted in accordance with an illustrative embodiment. In this illustrative example, nanowire photodetection system 2100 is an example of an implementation for nanowire photodetection system 100 in FIG. 1.

As depicted, nanowire photodetection system 2100 is shown in a plan view and comprises optical waveguide 2102 located on substrate 2104. In this example, superconducting nanowire 2106 extends across width 2111 of optical waveguide 2102. Superconducting nanowire 2108 is a subset of the superconducting nanowires that does not cross width 2111 of optical waveguide 2102. This subset of the of the superconducting nanowires does not absorb photons 2107 in the optical waveguide. Further, in this example, a first connector wire, superconducting connector wire 2114, extends from a first side of optical waveguide 2102 to a second side of optical waveguide 2102. With this configuration of superconducting connector wire 2114, superconducting nanowire 2108 is connected to superconducting connector wire 2114 and a second connector wire, superconducting connector wire 2116, without crossing the optical waveguide 2102.

These two superconducting nanowires are connected in parallel to superconducting connector wire 2114 and superconducting connector wire 2116 located on either side of optical waveguide 2102. More specifically, the superconducting nanowires are electrically connected in parallel by having first ends connected to a first superconducting connector wire, superconducting connector wire 2114, and second ends connected to a second superconducting connector wire, superconducting connector wire 2116.

Superconducting connector wire 2114 has contact pad 2117, and superconducting connector wire 2116 has contact pad 2119. These contact pads can be used to connect nanowire photodetection system 2100 to other devices that can detect currents generated in response to detecting photons 2107 traveling through optical waveguide 2102.

Further in this example, superconducting nanowire 2106 has active sensor area 2122 for detecting photons 2107. Active sensor area 2122 encompasses an area over width 2111 of optical waveguide 2102. In this example, superconducting nanowire 2108 does not have an active sensor area over optical waveguide 2102.

With this example, at least one of the superconducting nanowires does not cross the optical mode of a photon in optical waveguide 2102 and thus does not contribute to the sensor active area of the device. This configuration enables superconducting nanowire 2108 to be located away from optical waveguide 2102 where fewer constrictions occur as a result of device fabrication. In this example, the superconducting nanowire 2108 is not located on optical waveguide 2102. This superconducting nanowire can be located a small distance away from the waveguide such as 10*s* of nm. In other examples, superconducting nanowire 2108 can be located a large distance away from the waveguide such as 100*s* of microns.

With this example, any portion of the superconducting nanowire 2108 leading up to the nanowire that does overlap with the waveguide can absorb photons 2107 traveling in optical waveguide 2102 but does not result in the superconducting nanowire exceeding its critical current. Other nanowires that comprise the sensor active area can be configured such that these superconducting nanowires absorb practically all of photons 2107 that travel through optical waveguide 2102.

Figure 22:
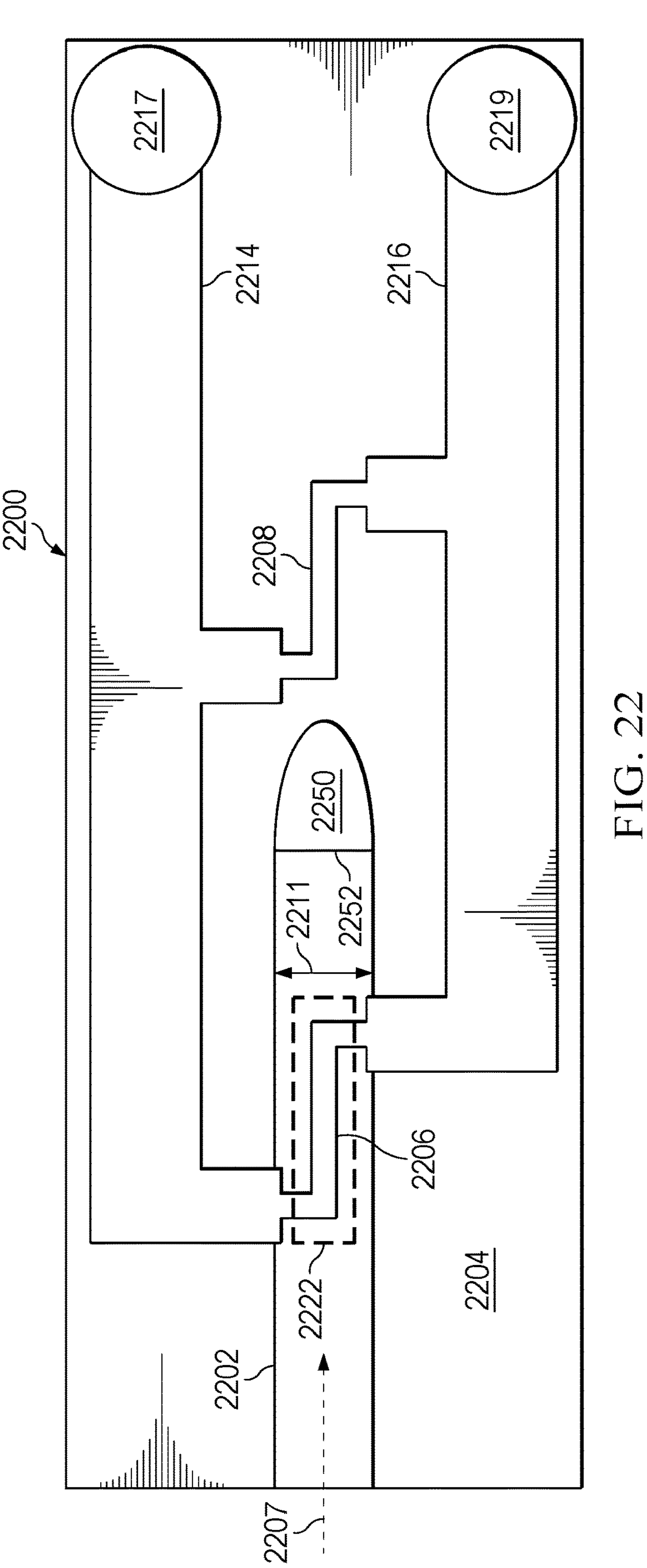
FIG. 22 is an illustration of a nanowire photodetection system with a portion of the superconducting nanowires not overlapping the optical waveguide in accordance with an illustrative embodiment.

In FIG. 22, an illustration of a nanowire photodetection system with a portion of the superconducting nanowires not overlapping the optical waveguide is depicted in accordance with an illustrative embodiment. In this illustrative example, nanowire photodetection system 2200 is an example of an implementation for nanowire photodetection system 100 in FIG. 1.

As depicted, nanowire photodetection system 2200 is shown in a plan view and comprises optical waveguide 2202 located on substrate 2204. In this example, superconducting nanowire 2206 extends across width 2211 of optical waveguide 2202. In this example, superconducting nanowire 2208 does not extend across width 2211 of optical waveguide 2202. Other numbers of superconducting nanowires may not cross optical waveguide 2202 when additional superconducting nanowires are present. In this example, optical waveguide 2202 terminates before reaching superconducting nanowire 2208.

These two superconducting nanowires are connected in parallel to superconducting connector wire 2214 and superconducting connector wire 2216 located on either side of optical waveguide 2202. More specifically, the superconducting nanowires are electrically connected in parallel by having first ends connected to a first superconducting connector wire, superconducting connector wire 2214, and second ends connected to a second superconducting connector wire, superconducting connector wire 2216.

Superconducting connector wire 2214 has contact pad 2217, and superconducting connector wire 2216 has contact pad 2219. These contact pads can be used to connect nanowire photodetection system 2200 to other devices that can detect currents generated in response to detecting photons 2207 traveling through optical waveguide 2202.

Further in this example, superconducting nanowire 2206 has active sensor area 2222 for detecting photons 2207. Active sensor area 2222 encompasses an area over width 2211 of optical waveguide 2202. Superconducting nanowire 2208 does not have an active sensor area because this wire does not extend across optical waveguide 2202.

In this example, reflector 2250 is incorporated within optical waveguide 2202 at end 2252 of optical waveguide 2202. By reflecting photons 2207 in optical waveguide 2202, additional opportunities are provided to superconducting nanowire 2206 to absorb a photon that was not absorbed on the first pass through optical waveguide 2202. As result, reflector 2250 increases the detection efficiency of nanowire photodetection system 2200.

Figure 23:
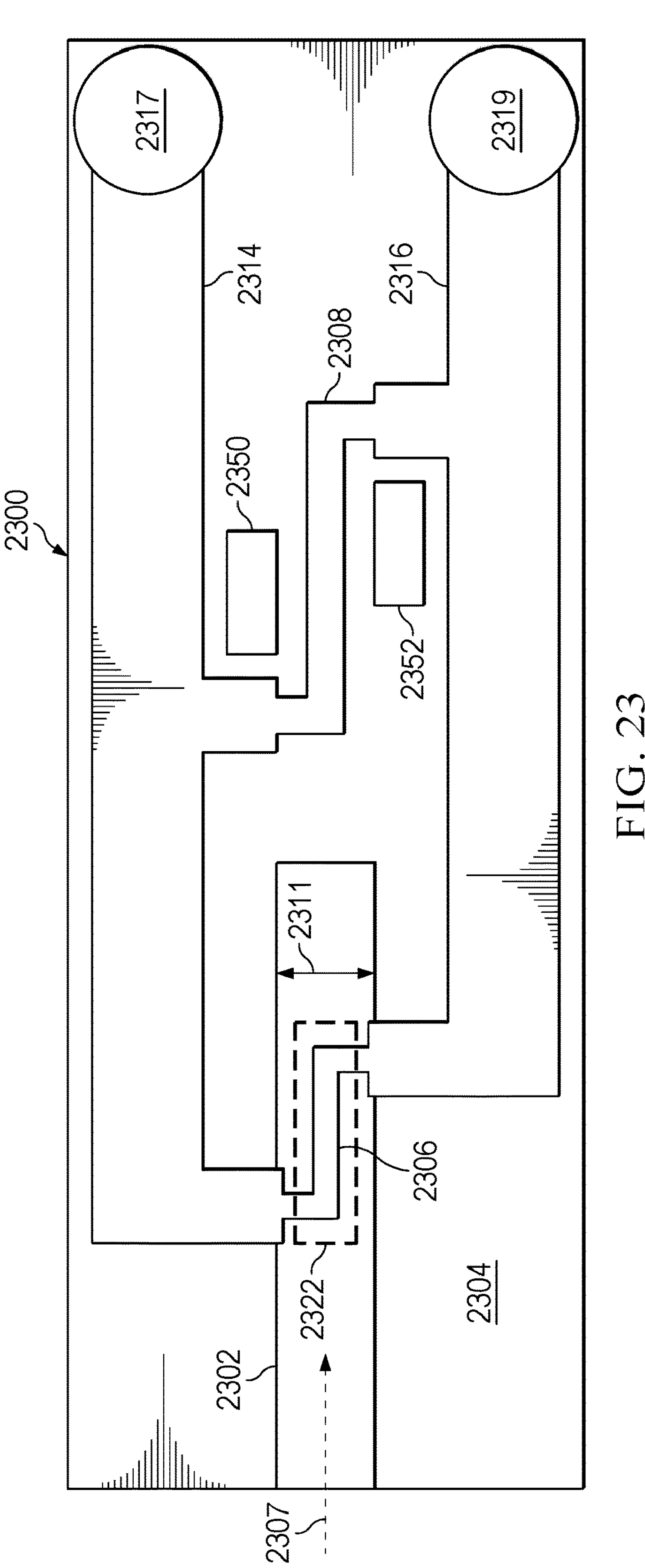
FIG. 23 is an illustration of a nanowire photodetection system with a portion of the superconducting nanowires not overlapping the optical waveguide in accordance with an illustrative embodiment.

In FIG. 23, an illustration of a nanowire photodetection system with a portion of the superconducting nanowires not overlapping the optical waveguide is depicted in accordance with an illustrative embodiment. In this illustrative example, nanowire photodetection system 2300 is an example of an implementation for nanowire photodetection system 100 in FIG. 1.

As depicted, nanowire photodetection system 2300 is shown in a plan view and comprises optical waveguide 2302 located on substrate 2304. In this example, superconducting nanowire 2306 extends across width 2311 of optical waveguide 2302. In this example, superconducting nanowire 2308 does not extend across width 2311 of optical waveguide 2302. Other numbers of superconducting nanowires may not cross optical waveguide 2302 when additional superconducting nanowires are present. In this example, optical waveguide 2302 terminates before reaching superconducting nanowire 2308.

These two superconducting nanowires are connected in parallel to superconducting connector wire 2314 and superconducting connector wire 2316 located on either side of optical waveguide 2302. More specifically, the superconducting nanowires are electrically connected in parallel by having first ends connected to a first superconducting connector wire, superconducting connector wire 2314, and second ends connected to a second superconducting connector wire, superconducting connector wire 2316.

Superconducting connector wire 2314 has contact pad 2317, and superconducting connector wire 2316 has contact pad 2319. These contact pads can be used to connect nanowire photodetection system 2300 to other devices that can detect currents generated in response to detecting photons 2307 traveling through optical waveguide 2302.

Further in this example, superconducting nanowire 2306 has active sensor area 2322 for detecting photons 2307. Active sensor area 2322 encompasses an area over width 2311 of optical waveguide 2302. Superconducting nanowire 2308 does not have an active sensor area because this superconducting nano nanowire does not extend across optical waveguide 2302.

In this illustrative example, a set of tuning electrodes are positioned relative to superconducting nanowire 2308. The set of tuning electrodes is tuning electrode 2350 and tuning electrode 2352 located on either side of superconducting nanowire 2308.

Further, in this illustrative example, superconducting nanowire 2308 is wider than superconducting nanowire 2306. This difference in width can result in superconducting nanowire 2308 having a higher critical current than superconducting nanowire 2306. Further, the larger width of superconducting nanowire 2308 makes forming the structure less susceptible to imperfections or constrictions. Tuning electrode 2350 and tuning electrode 2352 are used to tune the critical current for superconducting nanowire 2308. As a result, design and manufacturing this device can focus more on reducing imperfections or constrictions in superconducting nanowire 2306. As a result, manufacturing yields can be increased with this configuration.

Figure 24:
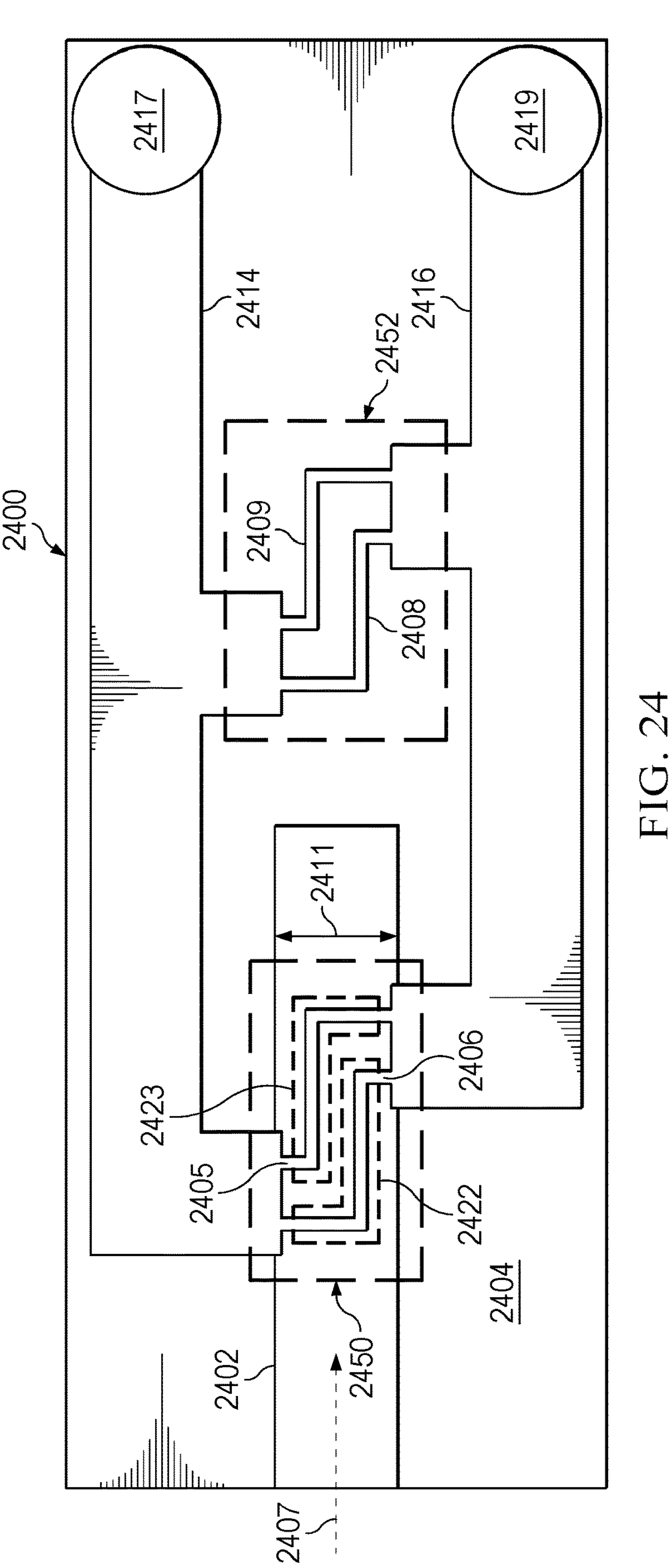
FIG. 24 is an illustration of a nanowire photodetection system with using stages of superconducting nanowires in which a portion of the stages do not overlap the optical waveguide in accordance with an illustrative embodiment.

In FIG. 24, an illustration of a nanowire photodetection system with using stages of superconducting nanowires in which a portion of the stages do not overlap the optical waveguide is depicted in accordance with an illustrative embodiment. In this illustrative example, nanowire photodetection system 2400 is an example of an implementation for nanowire photodetection system 100 in FIG. 1.

As depicted, nanowire photodetection system 2400 is shown in a plan view and comprises optical waveguide 2402 located on substrate 2404. In this example, superconducting nanowire 2406 and superconducting nanowire 2405 extends across width 2411 of optical waveguide 2402. In this example, a portion of both of these superconducting nanowires extend in the direction of travel for photons 2407 in optical waveguide 2402. In this example, superconducting nanowire 2408 and superconducting nanowire 2409 do not extend across width 2411 of optical waveguide 2402.

As depicted, first stage 2450 comprises superconducting nanowire 2406 and superconducting nanowire 2405. Second stage 2452 comprises superconducting nanowire 2408 and superconducting nanowire 2409.

These superconducting nanowires are connected in parallel to superconducting connector wire 2414 and superconducting connector wire 2416 located on either side of optical waveguide 2402. More specifically, the superconducting nanowires are electrically connected in parallel by having first ends connected to a first superconducting connector wire, superconducting connector wire 2414, and second ends connected to a second superconducting connector wire, superconducting connector wire 2416.

Superconducting connector wire 2414 has contact pad 2417, and superconducting connector wire 2416 has contact pad 2419. These contact pads can be used to connect nanowire photodetection system 2400 to other devices that can detect currents generated in response to detecting photons 2407 traveling through optical waveguide 2402.

Further in this example, first stage 2450 has superconducting nanowire 2406 with active sensor area 2422 and superconducting a wire 2405 has active sensor area 2423 for detecting photons 2407 traveling through optical waveguide 2402. Second stage 2452 does not have an active sensor area because the superconducting nano nanowires in this stage do not extend across optical waveguide 2402. In this example, optical waveguide 2402 terminates before reaching second stage 2452.

Figure 25:
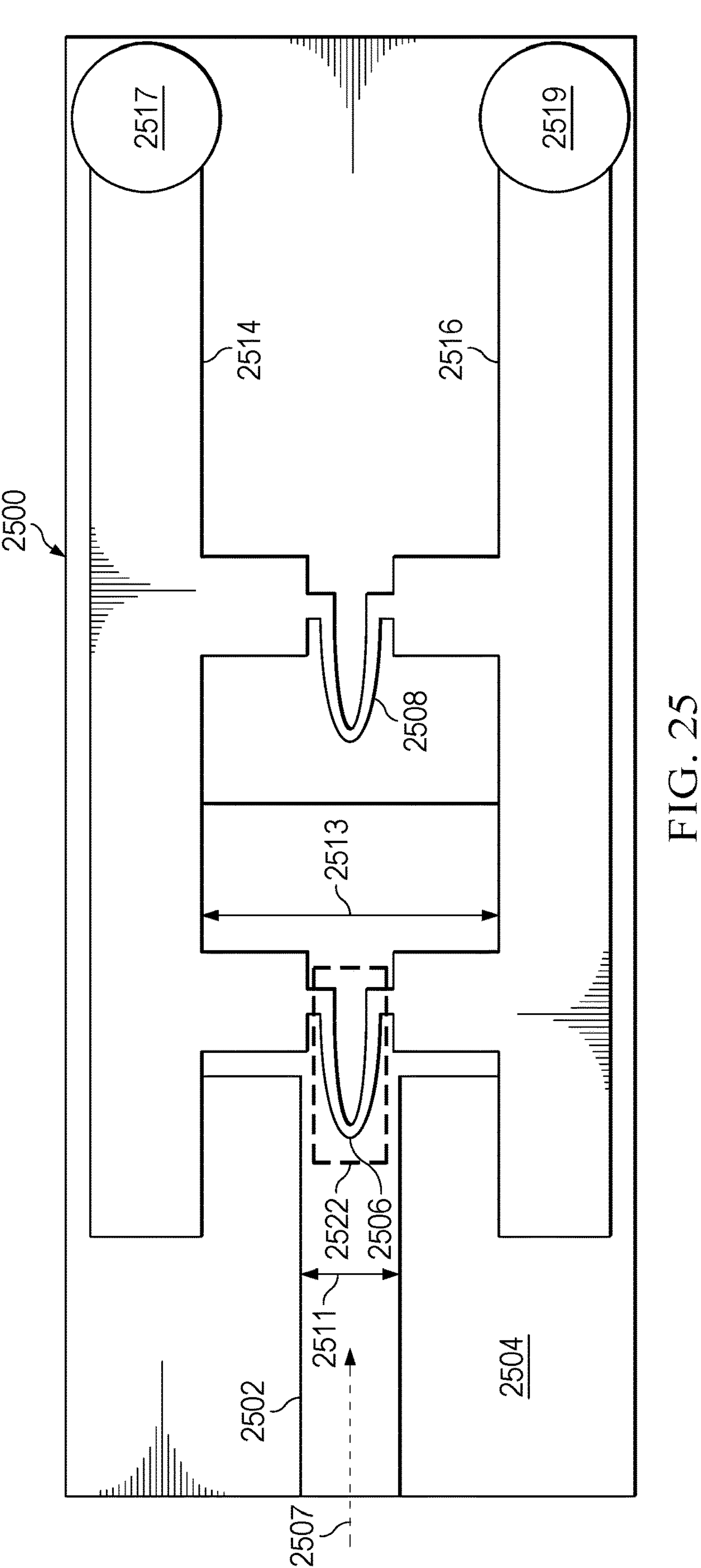
FIG. 25 is an illustration of a nanowire photodetection system with a portion of the superconducting nanowires not overlapping the optical waveguide in accordance with an illustrative embodiment.

In FIG. 25, an illustration of a nanowire photodetection system with a portion of the superconducting nanowires not overlapping the optical waveguide is depicted in accordance with an illustrative embodiment. In this illustrative example, nanowire photodetection system 2500 is an example of an implementation for nanowire photodetection system 100 in FIG. 1.

As depicted, nanowire photodetection system 2500 is shown in a plan view and comprises optical waveguide 2502 located on substrate 2504. In this example, superconducting nanowire 2506 extends across a width of optical waveguide 2502. In this example, superconducting nanowire 2508 does not extend across a width of optical waveguide 2502. Other numbers of superconducting nanowires may not cross optical waveguide 2502 when additional superconducting nanowires are present. In this example, optical waveguide 2502 terminates before reaching superconducting nanowire 2508.

These two superconducting nanowires are connected in parallel to superconducting connector wire 2514 and superconducting connector wire 2516 located on either side of optical waveguide 2502. More specifically, the superconducting nanowires are electrically connected in parallel by having first ends connected to a first superconducting connector wire, superconducting connector wire 2514, and second ends connected to a second superconducting connector wire, superconducting connector wire 2516.

Superconducting connector wire 2514 has contact pad 2517, and superconducting connector wire 2516 has contact pad 2519. These contact pads can be used to connect nanowire photodetection system 2500 to other devices that can detect currents generated in response to detecting photons 2507 traveling through optical waveguide 2502.

Further in this example, superconducting nanowire 2506 has active sensor area 2522 for detecting photons 2507. Active sensor area 2522 encompasses an area over width 2511 of optical waveguide 2502. Superconducting nanowire 2508 does not have an active sensor area because this superconducting nano nanowire does not extend across optical waveguide 2502.

For example, optical waveguide 2502 includes a change in its geometry near at least one superconducting nanowire. In this case, the change in geometry occurs near superconducting nanowire 2506. The change of geometry in this example is a change from width 2511 to second width 2513.

As depicted, the geometry of the waveguide becomes wider near superconducting nanowire 2506. This change in geometry enables the superconducting material in superconducting connector wire 2314 and superconducting connector wire 2316 to taper to larger widths without traversing a material boundary, leading to fewer constrictions in the superconducting material. In one illustrative example, photons 2507 can be absorbed by superconducting nanowire 2506 prior to reaching change in with an optical waveguide 2502.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component can be configured to perform the action or operation described. For example, the component can have a configuration or design for a structure that provides the component an ability to perform the action or operation that is described in the illustrative examples as being performed by the component. Further, to the extent that terms "includes", "including", "has", "contains", and variants thereof are used herein, such terms are intended to be inclusive in a manner similar to the term "comprises" as an open transition word without precluding any additional or other elements.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A nanowire photodetection system comprising:

an optical waveguide on a substrate; and superconducting nanowires electrically connected in parallel to connector wires located on both sides of the optical waveguide on the substrate, wherein a set of the superconducting nanowires cross a width of the optical waveguide and absorb a photon in the optical waveguide, wherein a subset of the superconducting nanowires does not cross the width of the optical waveguide and does not have an active sensor area over the width of the optical waveguide.

2. The nanowire photodetection system of claim 1 further comprising:

a set of tuning electrodes, wherein the set of tuning electrodes operate to change critical currents for a number of the superconducting nanowires.

3. The nanowire photodetection system of claim 2, wherein a set of tuning electrodes is positioned relative to a superconducting nanowire in the superconducting nanowires and operates to create an electric field with a strength in a region encompassing a portion of the superconducting nanowire such that a critical current for superconducting nanowire changes in response to the electric field.

4. The nanowire photodetection system of claim 2, wherein a first superconducting nanowire in the superconducting nanowires has a different width from a second superconducting nanowires and wherein at least one of the superconducting nanowire or the superconducting nanowire are associated with the set of electrodes.

5. The nanowire photodetection system of claim 3, wherein the set of tuning electrodes operate to equalize current flow through the superconducting nanowires.

6. The nanowire photodetection system of claim 1, wherein the superconducting nanowires are electrically connected in parallel by having first ends connected to a first connector wire and second ends connected to a second connector wire.

7. The nanowire photodetection system of claim 1, wherein each of the superconducting nanowires has an active sensor area over width of the optical waveguide.

8. The nanowire photodetection system of claim 1, wherein the subset of the of the superconducting nanowires does not absorb photons in the optical waveguide.

9. The nanowire photodetection system of claim 1 further comprising:

a reflector in the optical waveguide located after a superconducting nanowire in the superconducting nanowires in a direction of travel of a photon in the optical waveguide.

10. The nanowire photodetection system of claim 6 further comprising:

a choke inductor formed in a first connector wire in the connector wires after a superconducting nanowire in the superconducting nanowires, wherein the choke inductor impedes current flow such that current flows through the superconducting nanowires in response to one of the superconducting nanowires going into a normal state from detecting a photon.

11. The nanowire photodetection system of claim 1 further comprising:

a cladding on at least one side of the optical waveguide, wherein a portion of the superconducting nanowires are substantially planar above the optical waveguide and on a region adjacent to the optical waveguide.

12. The nanowire photodetection system of claim 1 further comprising:

a first stage comprising a first number of the superconducting nanowires crossing the optical waveguide, wherein the number of the superconducting nanowires has a first number of active sensor areas; and a second stage comprising a second number of the superconducting nanowires crossing the optical waveguide, wherein the second number of the superconducting nanowires have a second number of active sensor areas, wherein the second number of superconducting nanowires is less than or equal to the first number of superconducting nanowires.

13. The nanowire photodetection system of claim 12 further comprising:

a first choke inductor formed in a connector wire in the connector wires connecting the first stage to second stage; and a second choke inductor formed in a connector wire in the connector wires connected to the second stage.

14. The nanowire photodetection system of claim 1, wherein a superconducting nanowire in the superconducting nanowires is connected to a first connector wire and a second connector wire without crossing the optical waveguide.

15. The nanowire photodetection system of claim 1, wherein a portion of a superconducting nanowire in the superconducting nanowires extends in a direction of travel of a photon in the optical waveguide.

16. The nanowire photodetection system of claim 1, wherein a portion of the connector wires taper in width to the superconducting nanowires.

17. The nanowire photodetection system of claim 1, wherein the connector wires have different heights in regions adjacent to the optical waveguide.

18. The nanowire photodetection system of claim 1, wherein the connector wires are superconducting connector wires.

19. A nanowire photodetection system comprising:

an optical waveguide on a substrate;

superconducting nanowires electrically connected in parallel to superconducting connector wires located on both sides of the optical waveguide on the substrate, wherein a set of the superconducting nanowires cross a width of the optical waveguide and absorb a photon in the optical waveguide; and a set of tuning electrodes, wherein the tuning electrodes operate to change critical currents for the superconducting nanowires, wherein a subset of the superconducting nanowires does not cross the width of the optical waveguide and does not have an active sensor area over the width of the optical waveguide.

* * * * *